(12) United States Patent
Hatakeyama et al.

(10) Patent No.: US 9,507,262 B2
(45) Date of Patent: Nov. 29, 2016

(54) RESIST TOP-COAT COMPOSITION AND PATTERNING PROCESS

(71) Applicants: Shin-Etsu Chemical Co., Ltd., Tokyo (JP); Samsung Electronics Co., Ltd., Suwon-si, Gyeonggi-do (KR)

(72) Inventors: Jun Hatakeyama, Joetsu (JP); Hyun-Woo Kim, Suwon-si (KR)

(73) Assignees: Shin-Etsu Chemical Co., Ltd., Tokyo (JP); Samsung Electronics Co., Ltd. (KR)

(*) Notice: Subject to any disclaimer, the term of this patent is extended or adjusted under 35 U.S.C. 154(b) by 0 days.

(21) Appl. No.: 14/622,291

(22) Filed: Feb. 13, 2015

(65) Prior Publication Data
US 2015/0234274 A1    Aug. 20, 2015

(30) Foreign Application Priority Data
Feb. 14, 2014  (JP) .................. 2014-026586

(51) Int. Cl.
*G03F 7/09* (2006.01)
*G03F 7/20* (2006.01)
*G03F 7/11* (2006.01)

(52) U.S. Cl.
CPC .............. *G03F 7/091* (2013.01); *G03F 7/11* (2013.01); *G03F 7/2041* (2013.01)

(58) Field of Classification Search
CPC ...... G03F 7/0046; G03F 7/0048; G03F 7/11; G03F 7/20
See application file for complete search history.

(56) References Cited

U.S. PATENT DOCUMENTS

| | | | |
|---|---|---|---|
| 7,316,886 B2 | 1/2008 | Kanda | |
| 7,537,880 B2 | 5/2009 | Harada et al. | |
| 8,076,053 B2 | 12/2011 | Nakamura et al. | |
| 8,211,618 B2 | 7/2012 | Hatakeyama et al. | |
| 8,323,872 B2 | 12/2012 | Hatakeyama et al. | |
| 8,435,718 B2 | 5/2013 | Nakamura et al. | |
| 8,551,684 B2 | 10/2013 | Park et al. | |
| 8,603,728 B2 | 12/2013 | Prokopowicz et al. | |
| 8,623,589 B2 | 1/2014 | Kudo et al. | |
| 8,715,911 B2 | 5/2014 | Kim et al. | |
| 8,951,712 B2 * | 2/2015 | Hatakeyama | 430/273.1 |
| 2005/0277059 A1 * | 12/2005 | Kanda | 430/270.1 |
| 2007/0122741 A1 | 5/2007 | Hatakeyama et al. | |
| 2008/0090184 A1 | 4/2008 | Sui et al. | |
| 2010/0136486 A1 * | 6/2010 | Harada et al. | 430/296 |
| 2011/0123925 A1 | 5/2011 | Yun et al. | |
| 2012/0021355 A1 | 1/2012 | Kim et al. | |
| 2012/0040294 A1 | 2/2012 | Maeda et al. | |
| 2013/0209940 A1 | 8/2013 | Sakamoto et al. | |
| 2014/0045123 A1 | 2/2014 | Sagehashi et al. | |
| 2014/0051026 A1 | 2/2014 | Hasegawa et al. | |
| 2014/0080064 A1 * | 3/2014 | Hatakeyama | 430/296 |
| 2014/0080668 A1 | 3/2014 | Tsubaki | |
| 2015/0234278 A1 * | 8/2015 | Hatakeyama et al. | |

FOREIGN PATENT DOCUMENTS

| | | |
|---|---|---|
| JP | 09-246173 | 9/1997 |
| JP | 2003-149817 | 5/2003 |
| JP | 2005-352384 | 12/2005 |
| JP | 4425776 B2 | 3/2010 |
| JP | 4642452 B2 | 3/2011 |
| JP | 4771083 B2 | 9/2011 |
| JP | 4858714 B2 | 1/2012 |
| JP | 5463963 B2 | 4/2014 |
| KR | 1020120065745 A | 6/2012 |
| TW | 201214049 A1 | 4/2012 |
| WO | WO 2007/049637 A1 | 5/2007 |
| WO | WO 2010/123000 A1 | 10/2010 |

OTHER PUBLICATIONS

Office Action corresponding to Taiwanese Application No. 104105013 issued on Dec. 8, 2015.
Kim et al. "CD uniformity improvement for EUV resists process: EUV resolution enhancement layer", *Proc. of SPIE* 7969:796916-1 (2011).

* cited by examiner

*Primary Examiner* — Anca Eoff
(74) *Attorney, Agent, or Firm* — Myers Bigel, P.A.

(57) ABSTRACT

There are provided a top coat composition and a patterning process using that composition, which reduce the effect of contaminants in the surrounding atmosphere on the resist film in absorbing OOB light and in reducing film loss of the resist pattern and bridging between patterns, and also enhances the sensitivity of the resist film and suppresses the emission of outgas from the resist film. The resist top coat composition of the present invention is formed on a photoresist film formed on a wafer, and is used in a patterning process performed by lithography in which, after exposure, developing is performed. The resist top coat composition contains a polymer as a base resin having a repeating unit p of styrene having a 1,1,1,3,3,3-hexafluoro-2-propanol group shown by the following general formula (1), a C6-C10 ether compound, and a C7-C12 hydrocarbon compound, and wherein m is 1 or 2, and p is in the range of $0 < p \leq 1.0$.

9 Claims, No Drawings

RESIST TOP-COAT COMPOSITION AND PATTERNING PROCESS

CROSS-REFERENCE TO RELATED APPLICATION

This U.S. non-provisional patent application claims priority under 35 U.S.C. §119 to Japanese Patent Application No. 2014-026586, filed on Feb. 14, 2014. The disclosure of which is hereby incorporated herein by reference in its entirety.

TECHNICAL FIELD

The present invention relates to a resist top coat composition used in manufacturing semiconductor devices and the like, and to a patterning process using that composition.

BACKGROUND ART

As large-scale integration (LSI) progresses toward a higher integration density and faster processing speed, reduction of pattern rules progresses rapidly. In the background of this rapid progress of downscaling, projection lenses having a higher numerical apertures (NA) are being developed, resist-composition performance is being improved, and light sources are being shifted to shorter wavelengths.

Use of the resist composition for a krypton-fluoride (KrF) excimer laser (248 nm) began in a 0.3-μm process, and this has been applied to mass-production of a 0.13-μm rule. The shift to an argon-fluoride (ArF) excimer laser (193 nm), which has a shorter wavelength than a KrF excimer laser, makes it possible to reduce the design rule to 0.13 μm or less. However resins such as a novolak resin or a polyvinyl phenol resin, which have been used in the past, have strong absorption near 193 nm, and therefore they cannot be used as a resist base resin. To secure transparency and sufficient dry-etching resistance, an acryl resin and a cycloolefin-based alicyclic resin were evaluated, and as a result, mass-production of a device using ArF lithography was realized.

In the 45-nm-node devices, the wavelength of the exposure-light source was shortened, and thus $F_2$ lithography of 157 nm became a candidate for next-generation lithography. However, $F_2$ lithography has several problems, such as: increased cost of scanners due to the introduction of expensive $CaF_2$ single crystals in a projection lens; the need to change the optical system due to the extremely poor durability of soft pellicles, thereby necessitating the introduction of a hard pellicle; and decreased etching resistance of the resist. Thus, postponement of $F_2$ lithography and early introduction of ArF immersion lithography were proposed, and 45-nm node devices using ArF immersion lithography are being produced on a mass scale. For mass-production of a 32-nm node device, a double patterning process using a side-wall spacer has been adopted, but the process is long and complicated, which is a problem.

Extreme ultraviolet (EUV) lithography of 13.5-nm wavelength, instead of an expensive double-patterning process, is expected for devices after 32 nm, the resolution thereof being improved by shifting the exposure light to a wavelength that is shorter by more than one digit than previous lithography technology, and thus the development of EUV lithography of 13.5 nm is progressing. In EUV lithography, the power of a laser is weak, and the amount of light decreases according to the attenuation of the reflective mirror light, and thus the intensity of light reaching a wafer surface is low. Thus, to acquire throughput with low light intensity, development of a highly sensitive resist is urgently needed. However, if the sensitivity of the resist is enhanced, there is a problem of deterioration in resolution and edge roughness (LER: line-edge roughness and LWR: line-width roughness), and thus a trade-off relationship between increased sensitivity and deterioration in resolution and edge roughness has been pointed out.

An EUV resist is easily affected by contaminants in the atmosphere around it because of the resist's high sensitivity. An amine quencher usually is added to a chemically amplified resist to ease the effect of amine contamination in air, but the amount of the amine quencher added to an EUV resist is a small fraction of the amount of the amine quencher added to an ArF resist. Accordingly, an EUV resist tends to form a T-top shape by receiving the effect of the amine from the resist's surface. The formation of a top coat on a resist's upperlayer is effective in preventing amine contamination. In a chemically amplified resist of an early type for a KrF excimer laser based on a t-BOC (tertiary-butoxycarbonyl)-protected polyhydroxy styrene, to which an amine quencher was not added, the use of a top coat was effective. Even in an early stage of ArF immersion lithography, a top coat was used to prevent elution of an acid generator into water, thereby preventing formation of a T-top shape that would result from such elution. Here, also in the EUV lithography process, to form a top coat on the upperlayer of a resist was proposed as described in Non-patent Document 1. By forming a top coat, environmental resistance is improved and the outgas from resist film is reduced.

An EUV laser of DPP (discharge-produced plasma) and LPP (laser-produced plasma) emits, in addition to 13.5-nm-wavelength light, which is used for patterning, a weak broadband light having a wavelength of 140 nm to 300 nm (out-of-band, OOB). The intensity of this broadband light (hereinafter "OOB light") is weak, but the amount of the light's energy cannot be neglected because of its wide wavelength range. A Zr (zirconium) filter is provided to an EUV microstepper to cut the OOB light, but this decreases the light intensity. In an EUV scanner in which, to improve throughput, the light intensity is not allowed to decrease, it is possible to not use this filter. Because the OOB light decreases the pattern contrast that is formed by EUV light, there is a need to develop a resist material that has high sensitivity to EUV light and has low sensitivity to OOB light. In this regard, Non-patent Document 1 describes providing a top coat to absorb the OOB light on the upper layer of a resist and shows the advantage of the top coat shielding the upperlayer of the resist from the OOB light.

Many kinds of resist top coat compositions used in ArF immersion lithography have been proposed. Among them, Patent Document 1, mentioned below, discloses a top coat composition containing a repeating unit of a styrene having a 1,1,1,3,3,3-hexafluoro-2-propanol (HFA) group, which is supposed to be unpractical because it absorbs a very high amount of 193 nm-wavelength light.

It has been pointed out that, in the case of a top coat for immersion lithography, a solvent for a top coat dissolves the surface of the resist film, thereby causing mixing between the top coat and the resist film, and this in turn causes film loss of a resist pattern after the film has been developed (Patent Document 2). Especially, when an alcohol solvent is used, a great amount of film loss occurs. It has also been shown that an ether solvent or a C7-C11 hydrocarbon-based solvent, in addition to an alcohol solvent, is effective in inhibiting film loss (Patent Document 3). An example of a polymer that is soluble in ether solvents is a polymer that has a 1,1,1,3,3,3-hexafluoro-2-propanol (HFA) group, as described in Patent Document 2.

Non-patent Document 1 reports that (1) in the case of a positive-type resist film, when an entire wafer is exposed, the width of the lines in the peripheral region of a shot becomes narrower due to OOB light leaked from neighboring shots; and that (2) if a top coat that absorbs light having a wavelength of 200 nm to 300 nm is applied on a resist film, the variation of pattern size within a shot can be reduced. Patent Document 4 describes a top coat of a hydroxylstyrene or a cresol-novolak resin applied as a solution of alcoholic solvents such as 4-methyl-2-pentanol, 2-methyl-2-pentanol, isopropyl alcohol, 3,3,5-trimethyl-1-hexanol, or a mixed solvent of one or more of the aforementioned alcoholic solvents and one or more hydrocarbon-based solvents such as xylene.

PATENT DOCUMENTS

Patent Document 1: Japanese Unexamined Patent Application Publication No. 2005-352384
Patent Document 2: Japanese Patent No. 4771083
Patent Document 3: WO 2007/049637
Patent Document 4: United States Patent Application Publication No. 2012/0021355
Patent Document 5: Japanese Unexamined Patent Application Publication No. 2008-111103
Patent Document 6: Japanese Unexamined Patent Application Publication No. 2010-237661
Patent Document 7: Japanese Unexamined Patent Application Publication No. H9-246173
Patent Document 8: Japanese Unexamined Patent Application Publication No. 2006-169302
Patent Document 9: Japanese Unexamined Patent Application Publication No. 2003-149817
Patent Document 10: Japanese Unexamined Patent Application Publication No. 2006-178317

NON-PATENT DOCUMENT

Non-patent Document 1: Proc. SPIE Vol. 7969, p 796916-1 (2011)

SUMMARY OF THE INVENTION

Technical Problems to be Overcome by the Objectives of the Invention

The present invention, which was made in view of the problems described above, has the objectives of (1) providing a resist top coat composition that (a) not only reduces the effect of contaminants in the surrounding atmosphere on a resist film and effectively shields against OOB light, but (b) also reduces film loss of a resist pattern and bridging between patterns, (c) enhances the sensitivity of the resist film, and (d) suppresses the outgas from the resist film, and (2) providing a patterning process using this composition.

Solution to the Problems

The resist top coat composition according to an embodiment of the present invention aiming to achieve the above objectives is the composition, used in a patterning process on a photoresist film, wherein a resist top coat is formed by using the resist top coat composition on a photoresist film formed on a wafer, the resist top coat composition being used in the patterning process performed by lithography in which, after exposure, developing is performed, wherein the resist top coat composition contains a polymer as a base resin having a repeating unit p of a styrene having a 1,1,1,3,3,3-hexafluoro-2-propanol group shown by the following general formula (1), a C6-C10 ether compound, and a C7-C12 hydrocarbon compound, and wherein m is 1 or 2, and p is in the range of $0<p\le1.0$.

Chemical formula 1

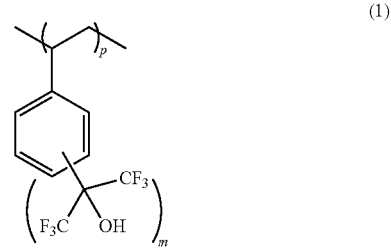

(1)

Said resist top coat composition contains a polymer compound made by copolymerizing the repeating unit p with one or more repeating units selected from the repeating units q1-q4 shown by the following general formula (2), wherein R1 is hydrogen, methyl; X1 is a single bond, —C(=O)—O—, —O—, —N=; X2 and X3 are independently phenylene, naphthylene; X4 is methylene, oxygen, sulfur; R2 is C6-C20-allyl, C2-C6-alkenyl; R3, R4, R5, and R6 are independently hydrogen, hydroxyl, linear, branched, or cyclic C1-C10-alkyl, C2-C6-alkenyl, C6-C10-allyl, alkoxy, acyloxy, cyano, nitro, amino, halogen; the alkyl, the alkenyl and the allyl may have hydroxyl, linear, branched, or cyclic C1-C10-alkyl, alkoxy, acyloxy, cyano, nitro, amino, halogen; v is 1 or 2; and $0<p\le1.0$, $0\le q1<1.0$, $0\le q2<1.0$, $0\le q3<1.0$, $0\le q4<1.0$, and $0\le q1+q2+q3+q4<1.0$.

Chemical formula 2

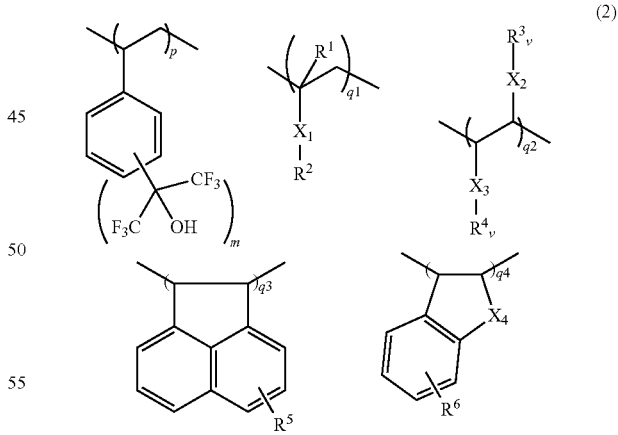

(2)

The resist top coat composition is soluble in an alkaline developer. The C6-C10 ether compounds contain one or more solvents selected from diisopropyl ether, diisobutyl ether, diisopentyl ether, di-n-pentyl ether, methylcyclopentyl ether, methyl cyclohexyl ether, di-n-butyl ether, di-sec-butyl ether, diisopentyl-ether, di-sec-pentyl ether, di-tert-amyl ether, and di-n-hexyl ether. The C7-C12 hydrocarbon compound has a boiling point in the range of 85° C.-250° C. under 1 atm (1013 hPa).

The C7-C12 hydrocarbon compounds refer to one or more hydrocarbon-based solvents selected from n-Heptane, isoheptane, 3-methyl hexane, 2,3-dimethyl pentane, 3-ethylpentane, 1,6-Heptadiene, 5-methyl-1-hexyne, norbornane, norbornene, dicyclopentadiene, 1-methyl-1,4-cyclohexadiene, 1-heptyne, 2-heptyne, cycloheptane, cycloheptene, 1,3-dimethy-cyclopentane, ethylcyclopentane, methylcyclohexane, 1-methyl-1-cyclohexene, 3-methyl-1-cyclohexene, methylenecyclohexane, 4-methyl-1-Cyclohexene, 2-methyl-1-hexene, 2-methyl-2-hexene, 1-Heptene, 2-Heptene, 3-Heptene, n-octane, 2,2-dimethyl hexane, 2,3-dimethyl hexane, 2,4-dimethyl hexane, 2,5-dimethyl hexane, 3,3-dimethyl hexane, 3,4-dimethyl hexane, 3-ethyl-2-methylpentane, 3-ethyl-3-methyl pentane, 2-methyl heptane, 3-methyl heptane, 4-methyl heptane, 2,2,3-trimethyl pentane, 2,2,4-trimethyl pentane, cyclooctane, cyclooctene, 1,2-dimethyl cyclohexane, 1,3-dimethyl cyclohexane, 1,4-dimethyl cyclohexane, ethyl cyclohexane, vinyl cyclohexane, isopropylcyclopentane, 2,2-dimethyl-3-hexene, 2,4-Dimethyl-1-hexene, 2,5-Dimethyl-1-hexene, 2,5-Dimethyl-2-hexene, 3,3-Dimethyl-1-hexene, 3,4-Dimethyl-1-hexene, 4,4-Dimethyl-1-hexene, 2-Ethyl-1-hexene, 2-Methyl-1-heptene, 1-octene, 2-octene, 3-octene, 4-octene, 1,7-Octadiene, 1-Octyne, 2-Octyne, 3-Octyne, 4-Octyne, n-nonane, 2,3-dimethyl-heptane, 2,4-dimethyl-heptane, 2,5-dimethyl-heptane, 3,3-dimethyl-heptane, 3,4-dimethyl-heptane, 3,5-dimethyl-heptane, 4-ethyl-heptane, 2-methyl-octane, 3-methyl-octane, 4-methyl-octane, 2,2,4,4-tetramethylpentane, 2,2,4-trimethyl hexane, 2,2,5-trimethyl hexane, 2,2-Dimethyl-3-heptene, 2,3-Dimethyl-3-heptene, 2,4-Dimethyl-1-heptene, 2,6-Dimethyl-1-heptene, 2,6-Dimethyl-3-heptene, 3,5-Dimethyl-3-heptene, 2,4,4-Trimethyl-1-hexene, 3,5,5-Trimethyl-1-hexene, 1-ethyl-2-methyl-cyclohexane, 1-ethyl-3-methyl-cyclohexane, 1-ethyl-4-methyl-cyclohexane, propyl cyclohexane, isopropyl cyclohexane, 1,1,3-trimethyl-cyclohexane, 1,1,4-trimethyl-cyclohexane, 1,2,3-trimethyl-cyclohexane, 1,2,4-trimethyl-cyclohexane, 1,3,5-trimethyl-cyclohexane, allyl cyclohexane, hydrindane, 1,8-Nonadiene, 1-Nonyne, 2-Nonyne, 3-Nonyne, 4-Nonyne, 1-Nonene, 2-Nonene, 3-Nonene, 4-Nonene, n-Decane, 3,3-dimethyl-octane, 3,5-dimethyl-octane, 4,4-dimethyl-octane, 3-ethyl-3-methyl heptane, 2-Methylnonane, 3-Methylnonane, 4-Methylnonane, tert-butyl-cyclohexane, butylcyclohexane, iso-butyl cyclohexane, 4-isopropyl-1-methyl-cyclohexane, pentylcyclopentane, 1,1,3,5-tetramethyl cyclohexane, cyclo dodecane, 1-Decene, 2-Decene, 3-Decene, 4-Decene, 5-Decene, 1,9-Decadiene, decahydronaphthalene, 1-Decyne, 2-Decyne, 3-Decyne, 4-Decyne, 5-Decyne, 1,5,9-Decatriene, 2,6-Dimethyl-2,4,6-octatriene, Limonene, Myrcene, 1,2,3,4,5-Pentamethylcyclopentadiene, α-Phellandrene, pinene, Terpinene, tetrahydrodicyclopentadiene, 5,6-dihydro-cyclopentadiene, Dicyclopentadiene, 1,4-Decadiyne, 1,5-Decadiyne, 1,9-Decadiyne, 2,8-Decadiyne, 4,6-Decadiyne, n-Undecane, amyl cyclohexane, 1-Undecene, 1,10-Undecadien, 1-Undecyne, 3-Undecyne, 5-Undecyne, Tricyclo[6.2.1.02,7]undec-4-ene, n-dodecane, 2-methyl-undecane, 3-methyl-undecane, 4-methyl-undecane, 5-methyl undecane, 2,2,4,6,6-penta-methyl-heptane, 1,3-Dimethyl-adamantane, 1-ethyl-adamantane, 1,5,9-Cyclododecatriene, toluene, xylene, cumene, 1,2,3-Trimethylbenzene, 1,2,4-Trimethylbenzene, 1,3,5-Trimethylbenzene, styrene, α-methyl styrene, butyl benzene, sec-butyl-benzene, isobutyl benzene, cymene, diethyl-benzene, 2-ethyl-p-xylene, 2-propyl toluene, 3-propyl toluene, 4-propyl toluene, 1,2,3,5-tetramethyl toluene, 1,2,4,5-tetramethyl toluene, tetrahydronaphthalene, 4-Phenyl-1-butene, Tert-amyl benzene, amyl benzene, 2-tert-butyl-toluene, 3-tert-butyl-toluene, 4-tert-butyl-toluene, 5-isopropyl-m-xylene, 3-methyl-ethyl-benzene, tert-Butyl-3-ethylbenzene, 4-tert-Butyl-o-xylene, 5-tert-Butyl-m-xylene, tert-Butyl-p-xylene, 1,2-diisopropyl-benzene, 1,3-diisopropyl-benzene, 1,4-diisopropyl-benzene, di-propyl benzene, 3,9-Dodecadiyne, pentamethylbenzene, hexamethylbenzene, hexyl benzene, 1,3,5-triethylbenzene, and 1,2,4-Trivinylcyclohexane.

The solvent used for the resist top coat composition contains a hydrocarbon-based solvent of 30% or more by mass relative to the total mass of the solvent.

In the patterning process according to the above-mentioned embodiment of the present invention, a resist top coat is formed on a photoresist film formed on a wafer, and the patterning process is performed by lithography in which, after exposure, developing is performed, and the aforementioned resist top coat composition is used as the composition in the process.

In the patterning process according to another embodiment of the present invention, a resist top coat is formed on a photoresist film formed on a wafer, the exposure being performed in a vacuum, and the aforementioned resist top coat composition is used as the composition in the process.

In this embodiment, the exposure light is in the wavelength range of 3-nm to 15-nm, or an electron beam is used in the exposure. In the patterning process, the developing of the photoresist film by an alkaline developer and the removal of the resist top coat formed by using the resist top coat composition are simultaneously performed during the developing process after exposure.

Advantageous Effects of the Invention

By using the resist top coat composition of the present invention, head enlargement of the resist pattern due to an amine contamination in air can be avoided, and generation of outgas from the resist film by exposure in a vacuum can be suppressed. The resist top coat composition of the present invention is soluble in an alkaline developer, and thus removal of the top coat can be performed simultaneously as the resist film is being developed. In addition, the top coat composition of the present invention does not dissolve the resist film nor form a mixing layer, and thus there is no change in the resist shape after developing. Further, OOB light that has a wavelength of 140 nm to 300 nm and that is generated from an EUV laser or the like is absorbed so that the photoresist can be protected from being sensitized. According to some embodiments of the present invention, the resist top coat composition is made by adding polystyrene having a 1,1,1,3,3,3-hexafluoro-2-propanol group to a mixed solution of a hydrocarbon-based solvent that does not dissolve a resist layer and an ether solvent that dissolves a resist film to a small extent. Using such a resist top coat composition on the resist's upper layer does little damage to the resist layer and doesn't form a mixing layer between the top coat and the resist layer, thereby reducing film loss of the resist pattern after developing.

DESCRIPTION OF EMBODIMENT

The inventors of the present invention conducted an extensive investigation to accomplish the objectives mentioned above, and as a result found that a top coat as mentioned below was effective in reducing the adverse effects from the surrounding air on the resist film, in absorbing OOB light, and in reducing both the film loss of the resist pattern and the bridging between patterns. This top coat is soluble in an alkaline developer so that it can be simultaneously removed when the resist film is being developed, and this top coat's patterning process is simpler than that of a solvent-removal-type top coat, and thus it minimizes the increase in the processing cost.

It is generally said that at a 13.5-nm wavelength, hydrogen atoms, carbon atoms, silicon atoms, and sulfur atoms absorb little light, while oxygen atoms and fluorine atoms absorb much light. A fluorinated polymer has such high absorption at a 13.5-nm wavelength.

If a resist top coat absorbs much light at a 13.5-nm wavelength, the sensitivity of the resist film decreases. In EUV lithography which has low laser power, lowered sensitivity of the resist film is a problem. Accordingly, the resist top coat needs to be highly transparent. In addition, a fluorinated polymer, which is not soluble in an alkaline developer, requires a separate cup exclusively dedicated for removal of the resist top coat before developing, thereby leading to a cumbersome process. A top coat that can be removed simultaneously as the resist film is being developed is desirable, and thus a material having an alkaline-soluble group is necessary in designing the top coat composition. The top coat composition that is mentioned below satisfies such requirements.

Carboxyl groups, phenol groups, sulfo groups, hexafluoroalcohol groups, and so forth are considered to be alkaline-soluble groups. But in regard to transparency, hexafluoroalcohol groups have strong absorption due to them having six fluorine atoms. However, a polymer having a hexafluoroalcohol group is advantageous because of its good solubility in ether solvents that do little damage to a resist film. A polymer having a hexafluoroalcohol group is soluble in ether solvents that cause little damage to a resist film, but it is not soluble in a mixed solution of an ether solvent and a hydrocarbon-based solvent, whereby it is possible to minimize solvent-caused damage to a resist film.

In the case of a top coat composition for immersion lithography used for an ArF resist based on polymethacrylic acid, even if an alcohol solvent is used, the solvent causes little damage to a resist film. In order to further lessen the solvent damages of the resist film, a mixed solvent of an alcohol solvent and an ether solvent or a mixed solvent of an alcohol solvent and a hydrocarbon-based solvent was used, as described in Patent Document 3. However, applying an alcohol solvent to a hydroxystyrene-based EUV resist causes substantial film loss of the resist pattern, which makes it impossible for the pattern to be formed. This is because a hydroxystyrene-based polymer is easily dissolved in an alcohol solvent. Mixing either an ether solvent or a hydrocarbon-based solvent in an alcohol solvent does not prevent film loss.

An example of a solvent that does not damage a hydroxystyrene polymer is water. As a top coat using a water solvent for hydroxystyrene, an anti-reflection film for KrF lithography has been used. However, a water-soluble top coat material does not spread well when dispensed, due to the high surface energy of water, and therefore it is not possible for a water-soluble top coat material to be spread on a resist film. In order to reduce the surface energy, adding a surfactant to the material has been tested, but this has not been sufficiently effective. Although adding a surfactant having a perfluoroalkyl group has been effective in lowering surface tension, it became impossible to use a surfactant having a long-chained perfluoroalkyl group, due to harmful effects of perfluorooctane sulfonate (PFOS) on the ecosystem, and accordingly, it became impossible to lower the surface tension of the water. Thus, the necessity for advantageous top coats using solvents has increased.

An ether solvent does little damage to a methacrylic resist, but does some damage to a hydroxystyrene resist, which causes LWR to deteriorate. A hydrocarbon-based solvent does little damage to the hydroxystyrene resist, but it cannot dissolve a polymer that has a 1,1,1,3,3,3-hexafluoro-2-propanol (HFA) group. This has resulted in the idea of combining an ether solvent that dissolves a polymer having a 1,1,1,3,3,3-hexafluoro-2-propanol group (HFA) and a hydrocarbon-based solvent that does no damage to a hydroxystyrene resist, which has led to the invention of an alkali-soluble top coat composition, described herein, that does not damage a resist.

Accordingly, the present invention provides the resist top coat composition and patterning process described below.

The top base material for the resist top coat composition of the present invention uses a polymer that has a repeating unit p of styrene having a 1,1,1,3,3,3-hexafluoro-2-propanol group, and the one represented by the following general formula (1) is preferable.

Chemical formula 3

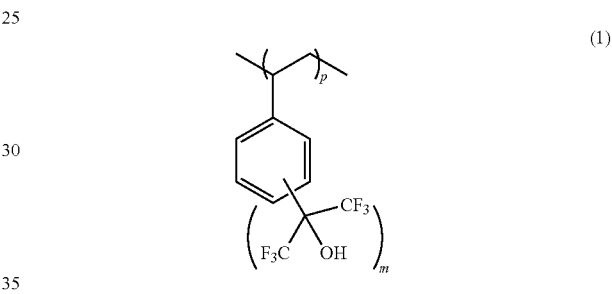

In general formula (1), m is 1 or 2; and p is 0<p≤1.0.

A polymer having a repeating unit of styrene having a 1,1,1,3,3,3-hexafluoro-2-propanol group is highly soluble in an ether solvent. Shown below is the monomer to obtain a repeating unit p.

Chemical formula 4

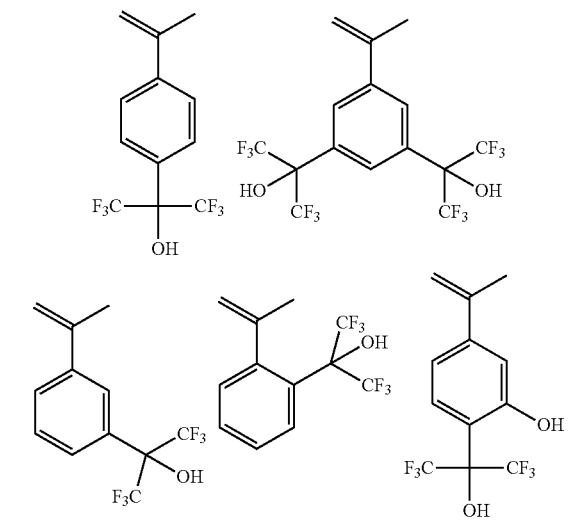

-continued

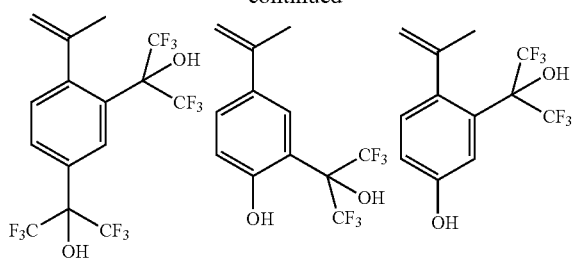

The repeating unit p of styrene having a 1,1,1,3,3,3-hexafluoro-2-propanol group can also be copolymerized with a hydrocarbon-based repeating unit, which reduces the percentage of fluorine, so as to increase transparency by EUV light, to reduce the amount of outgas from resist film, and to increase the capability to block OOB light. Also, by copolymerizing with a repeating unit that has a phenolic hydroxy group, the resist's sensitivity is advantageously raised due to the secondary electrons generated by EUV exposure diffused within the resist film. The repeating unit copolymerized with the repeating unit p is shown as q1-q4 in the following general formula (2).

Chemical formula 5

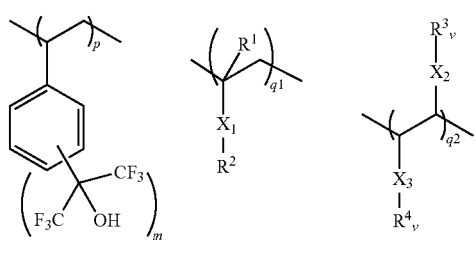

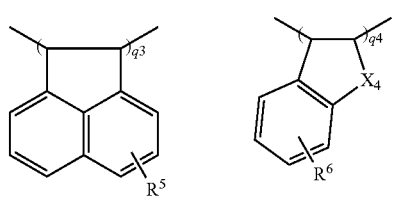

(In general formula (2), $R^1$ is hydrogen, methyl; $X_1$ is a single bond, —C(=O)—O—, —O—, —N=; $X_2$ and $X_3$ are phenylene, naphthylene; $X_4$ is methylene, oxygen, or sulfur; $R^2$ is C6-C20-allyl, C2-C6-alkenyl; $R^3$, $R^4$, $R^5$, and $R^6$ are independently hydrogen, hydroxyl linear, branched, or cyclic C1-C10-alkyl, C2-C6-alkenyl, C6-C10-allyl, alkoxy, acyloxy, cyano, nitro, amino, halogen; the alkyl, the alkenyl and the allyl may have hydroxyl, linear, branched, or cyclic C1-C10-alkyl, alkoxy, acyloxy, cyano, nitro, amino, halogen; v is 1 or 2; and $0 < p \leq 1.0$, $0 \leq q1 < 1.0$, $0 \leq q2 < 1.0$, $0 \leq q3 < 1.0$, $0 \leq q4 < 1.0$, and $0 \leq q1+q2+q3+q4 < 1.0$.)

A specific example of the monomer to obtain the repeating unit q1 includes the following.

Chemical formula 6

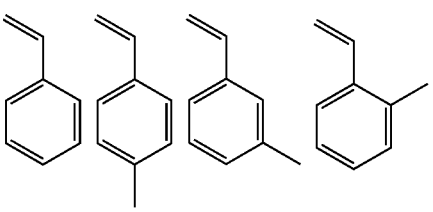

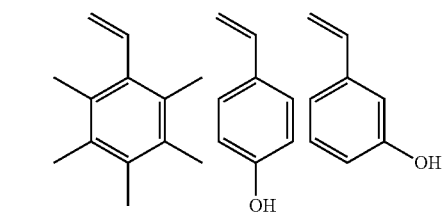

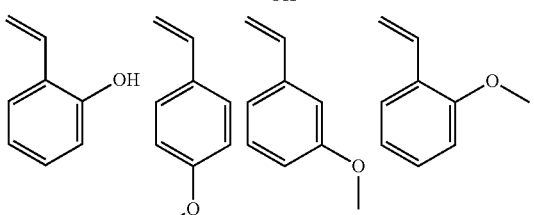

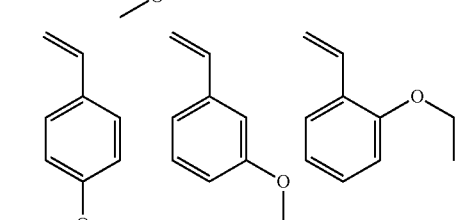

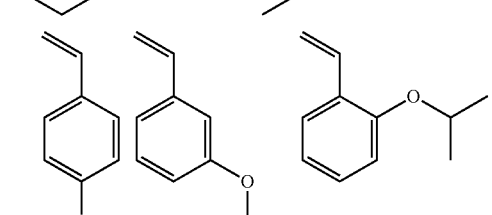

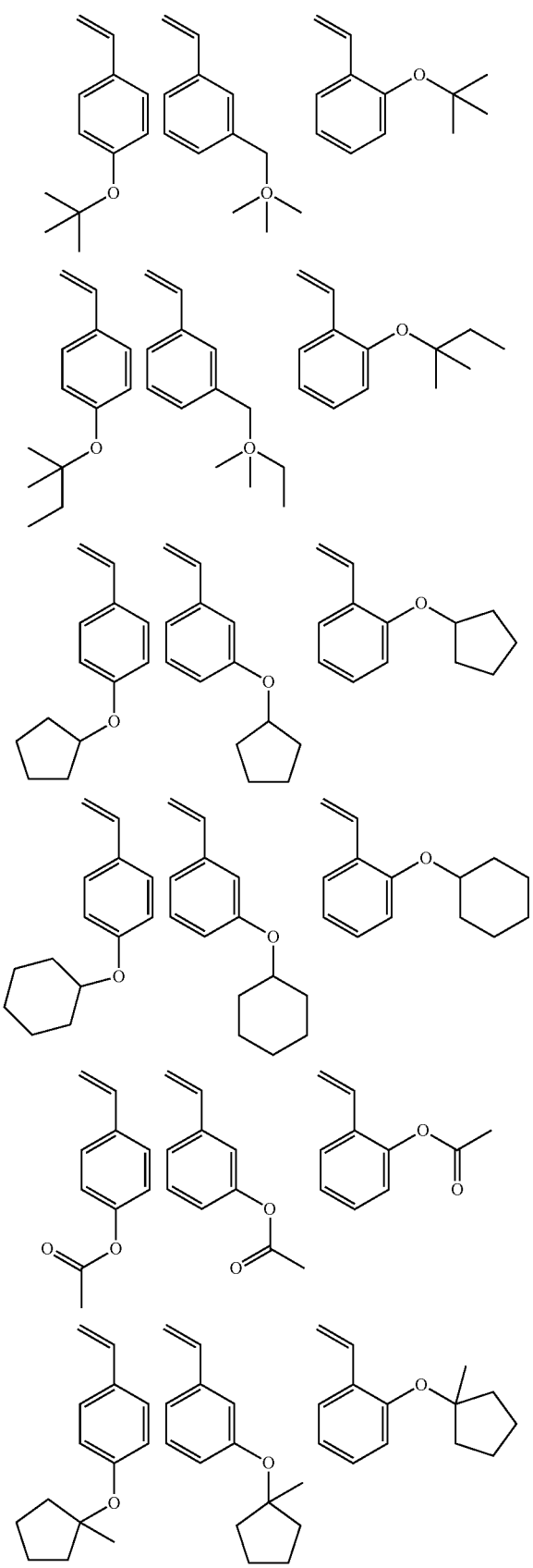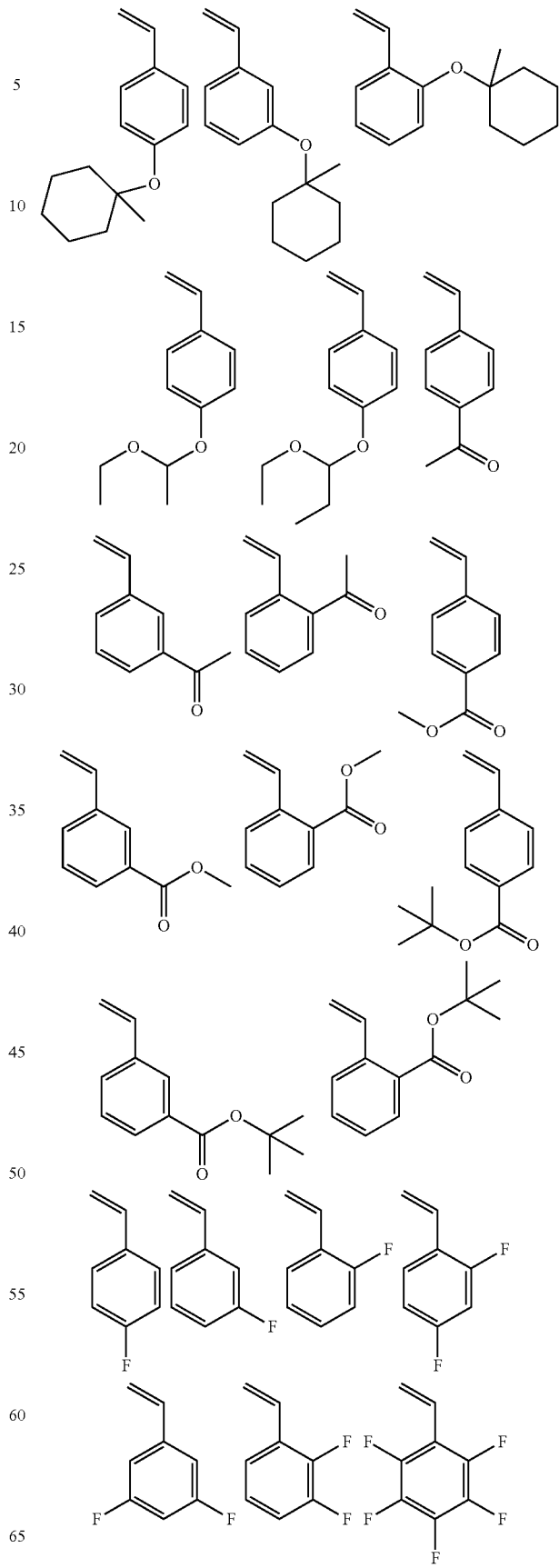

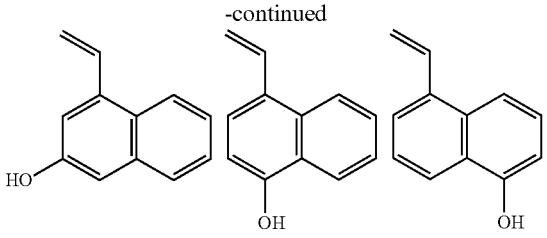
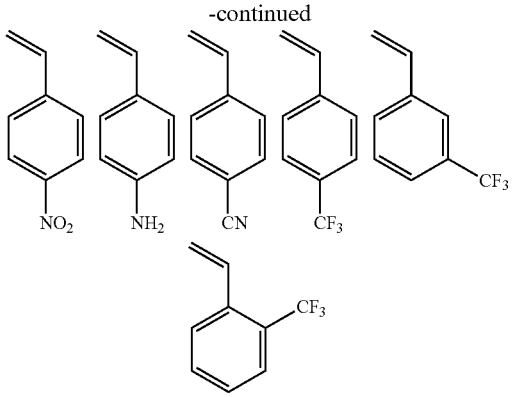
Chemical formula 7
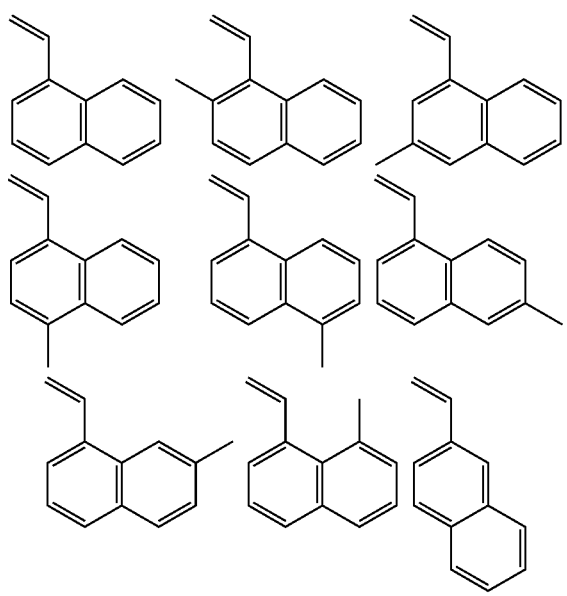
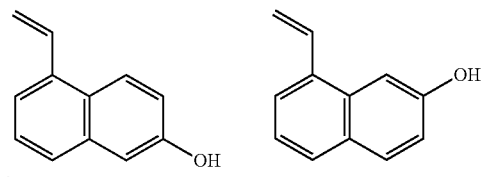
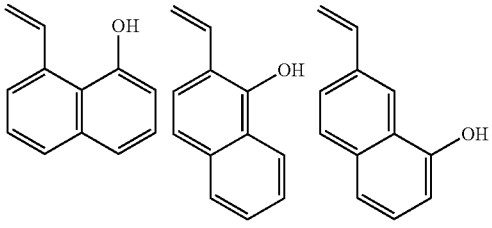
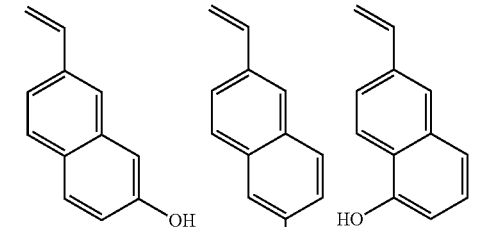
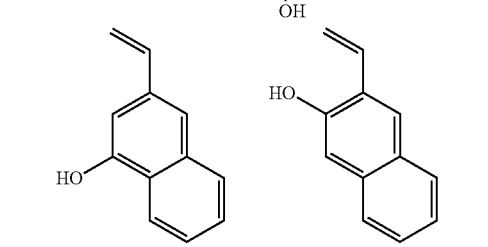
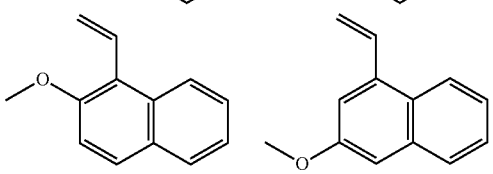
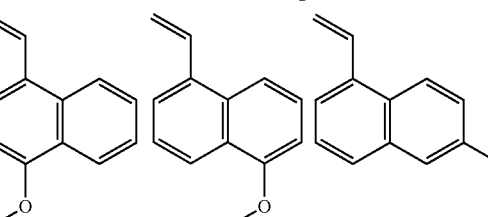
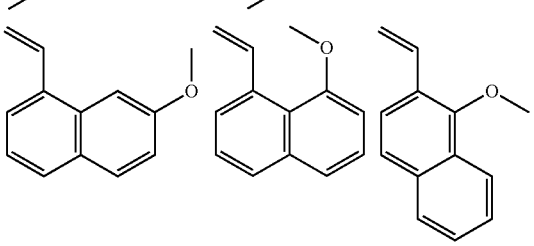

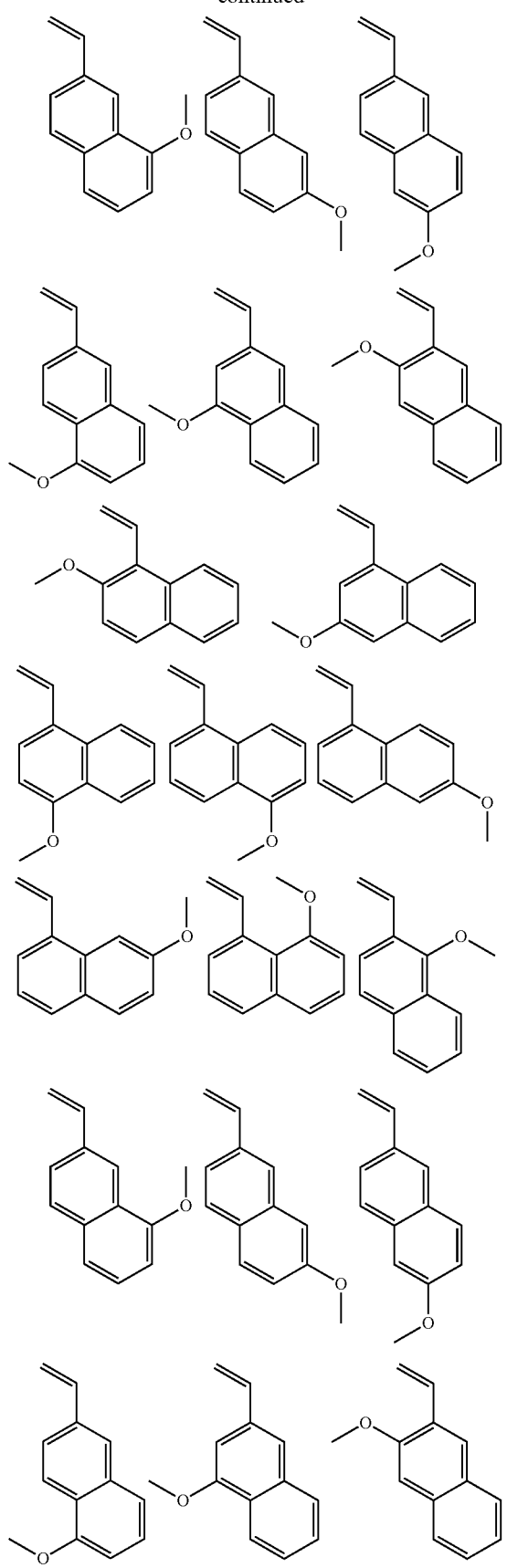
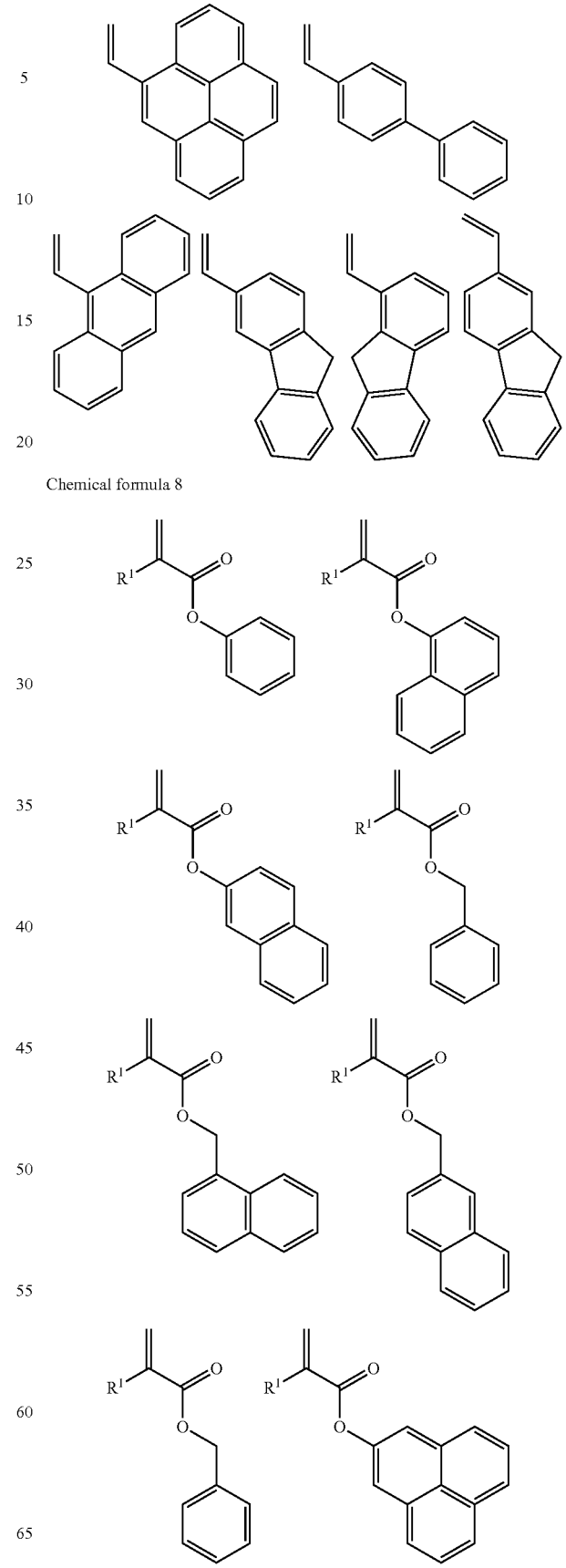
Chemical formula 8

17
-continued
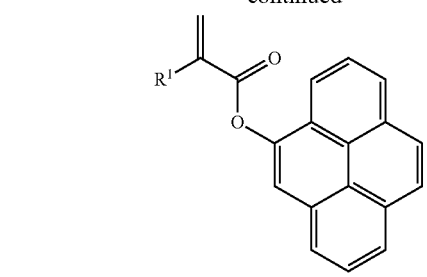
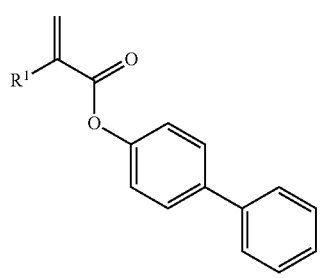
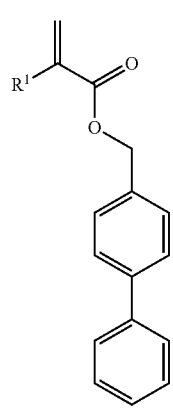
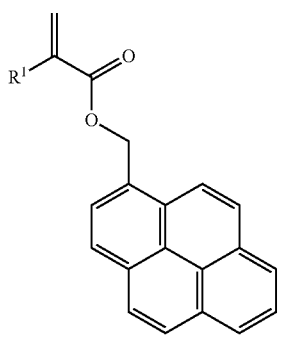
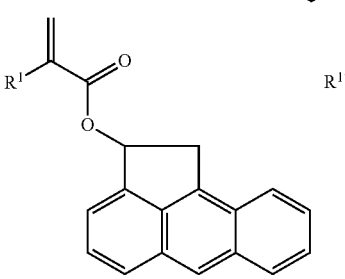
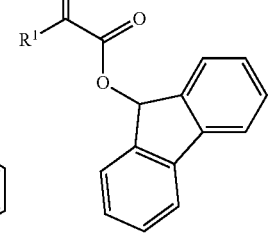
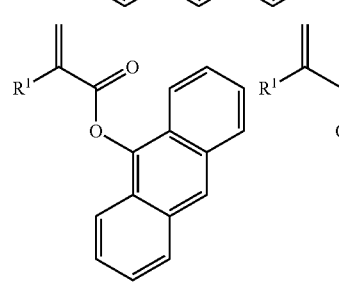
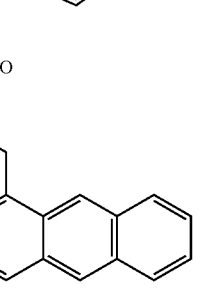
18
-continued
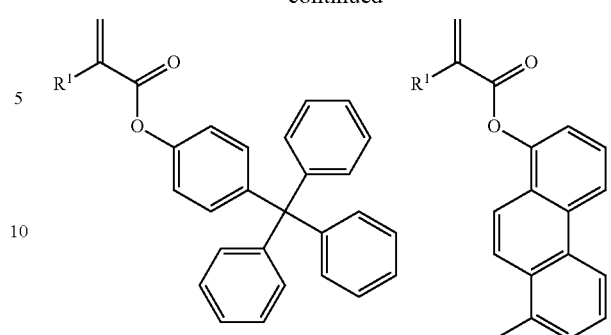
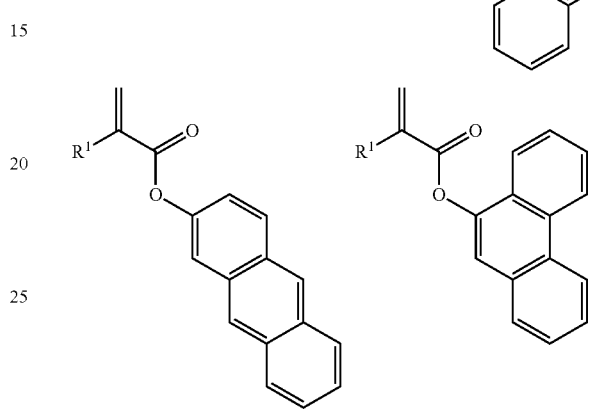
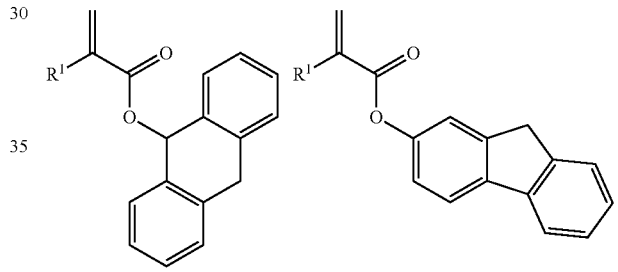
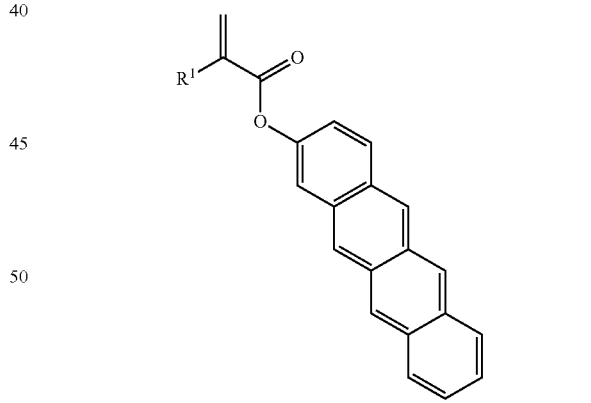
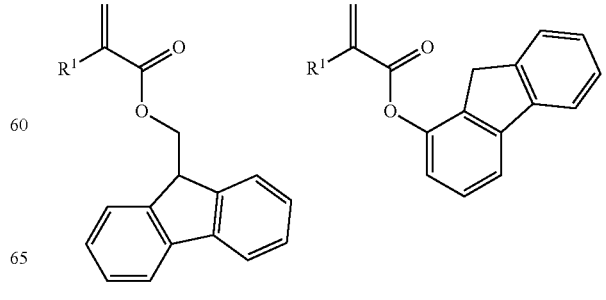

-continued
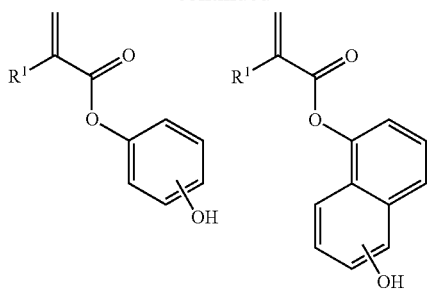
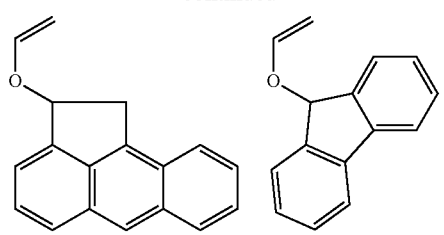
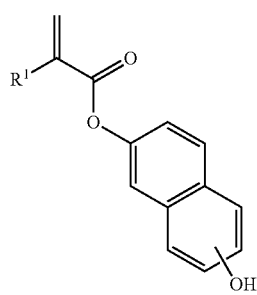
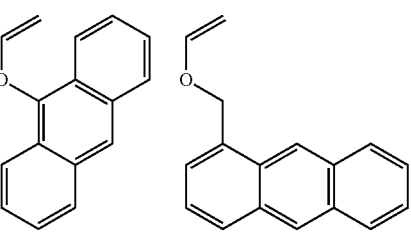
Chemical formula 9
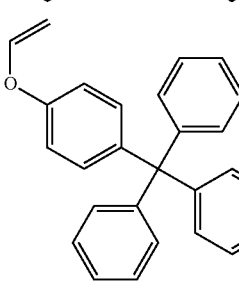
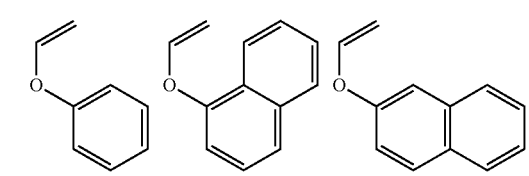
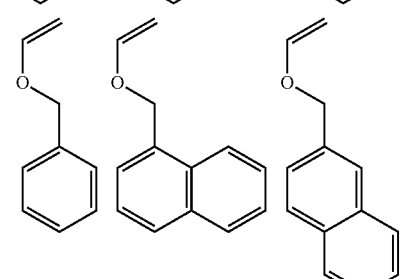
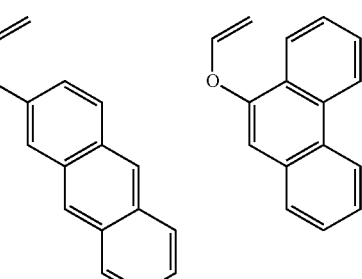
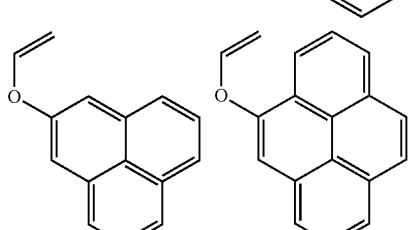
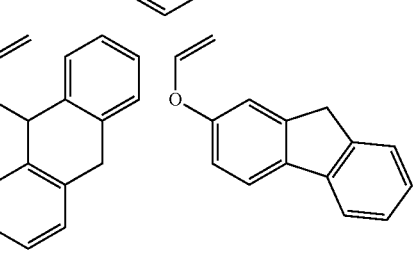
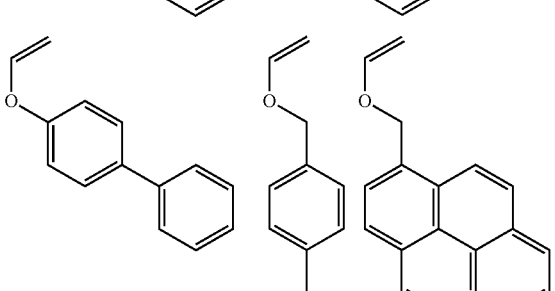
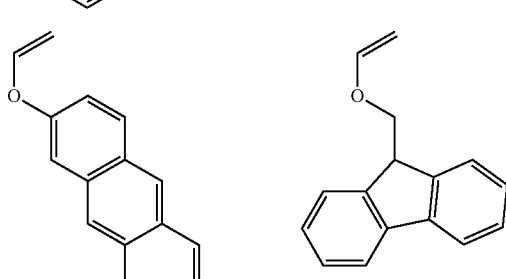
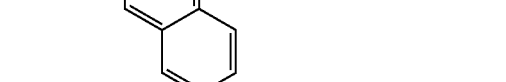

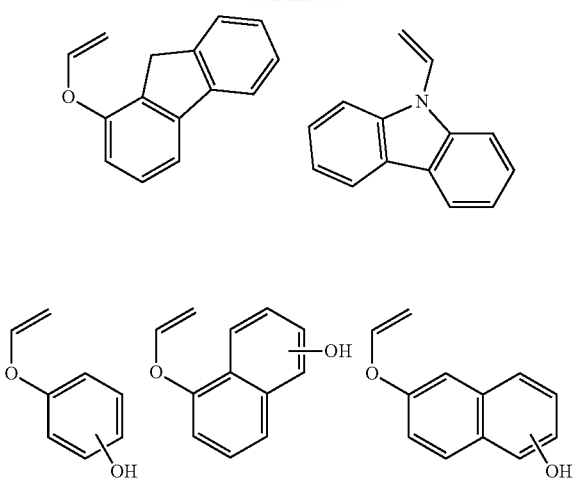
A specific example of the monomer to obtain the repeating unit q2 includes the following.
Chemical formula 10
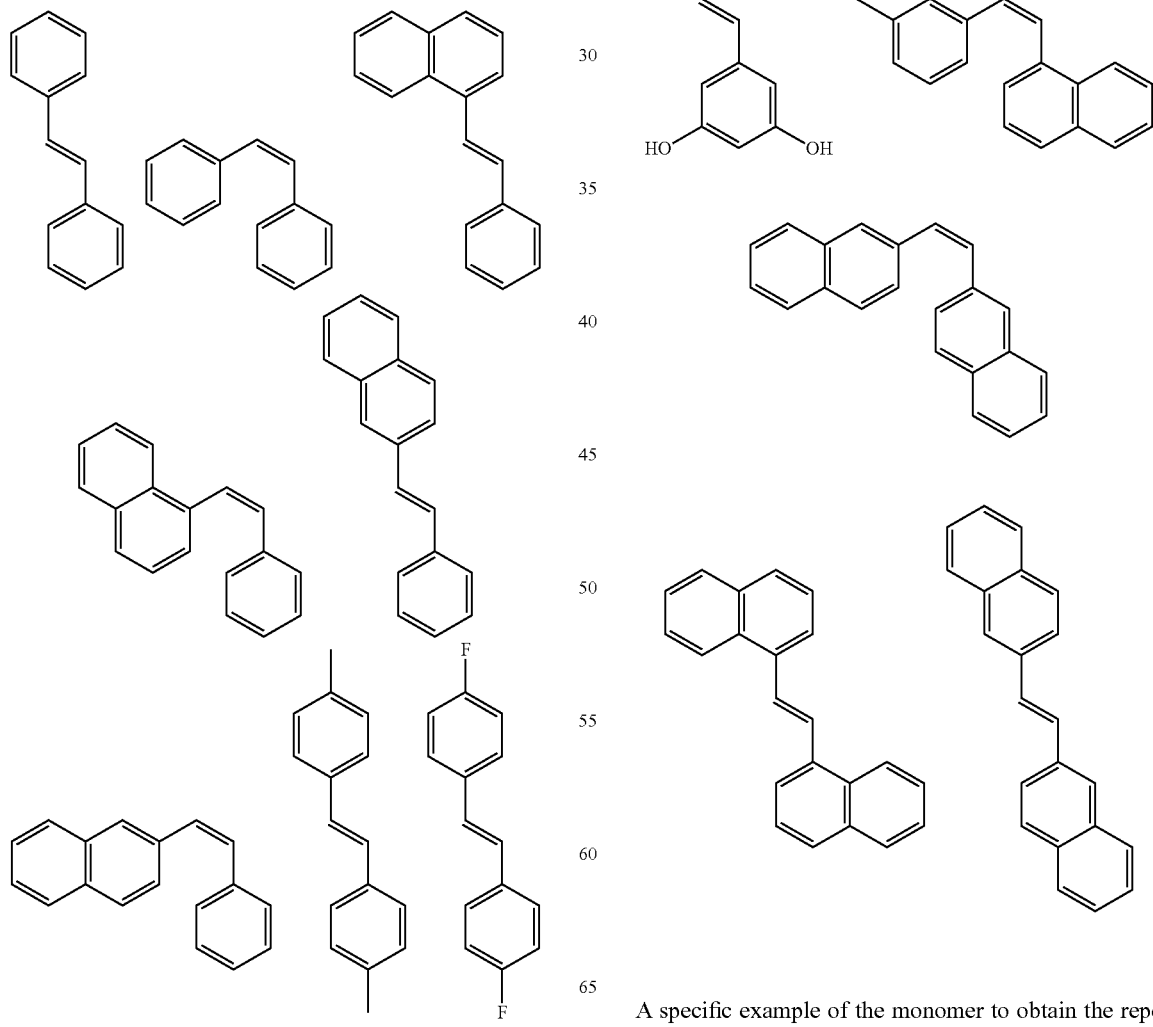
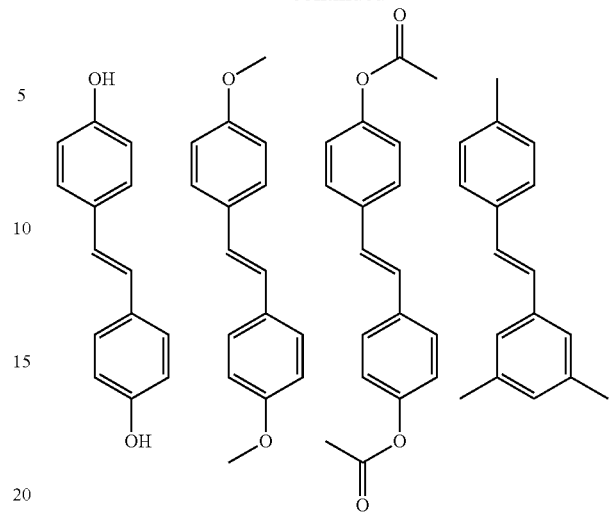
A specific example of the monomer to obtain the repeating unit q3 includes the following.

Chemical formula 11
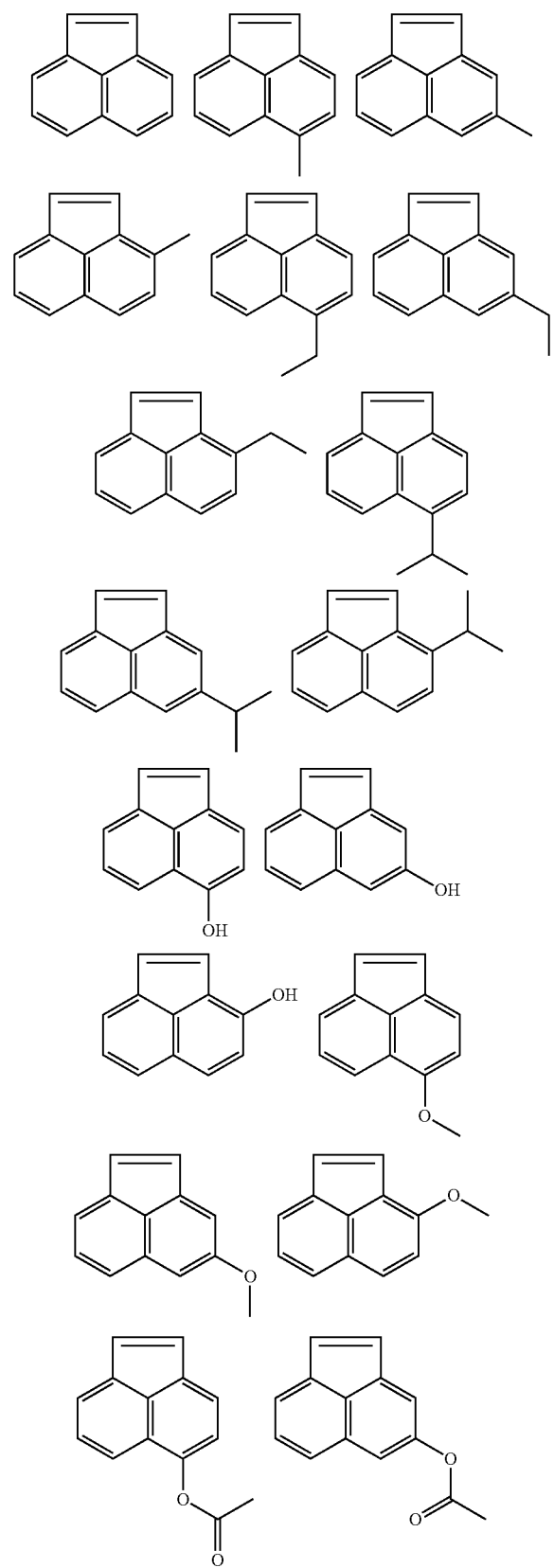
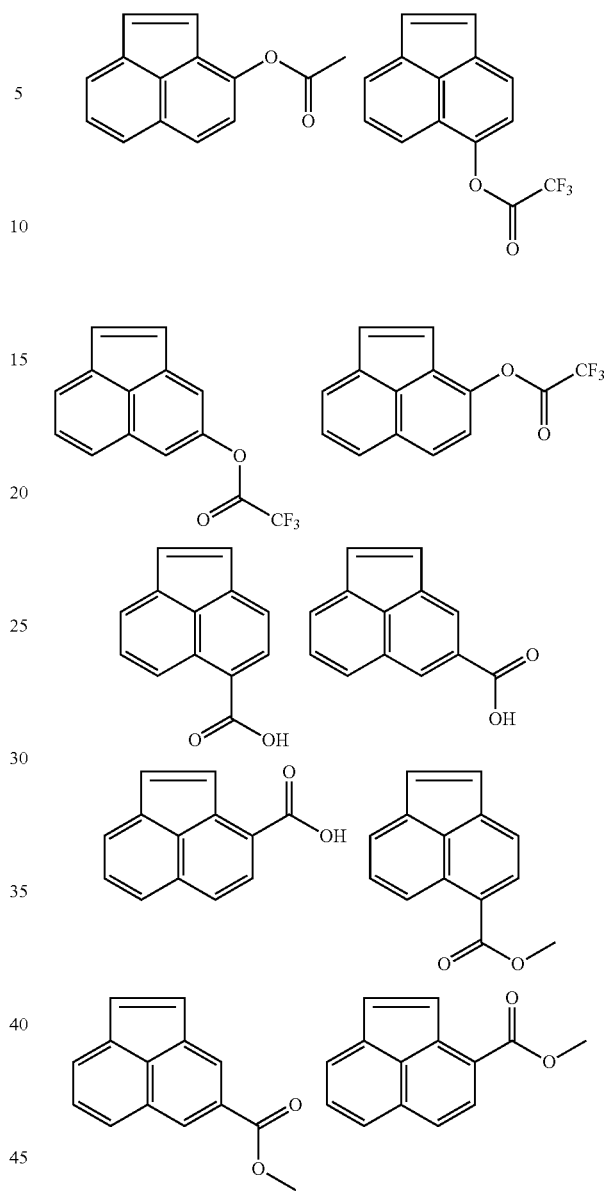
A specific example of the monomer to obtain the repeating unit q4 includes the following.
Chemical formula 12
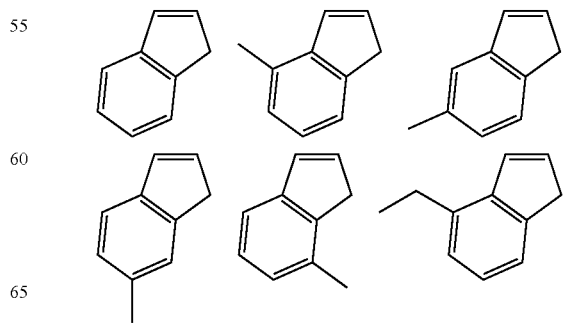

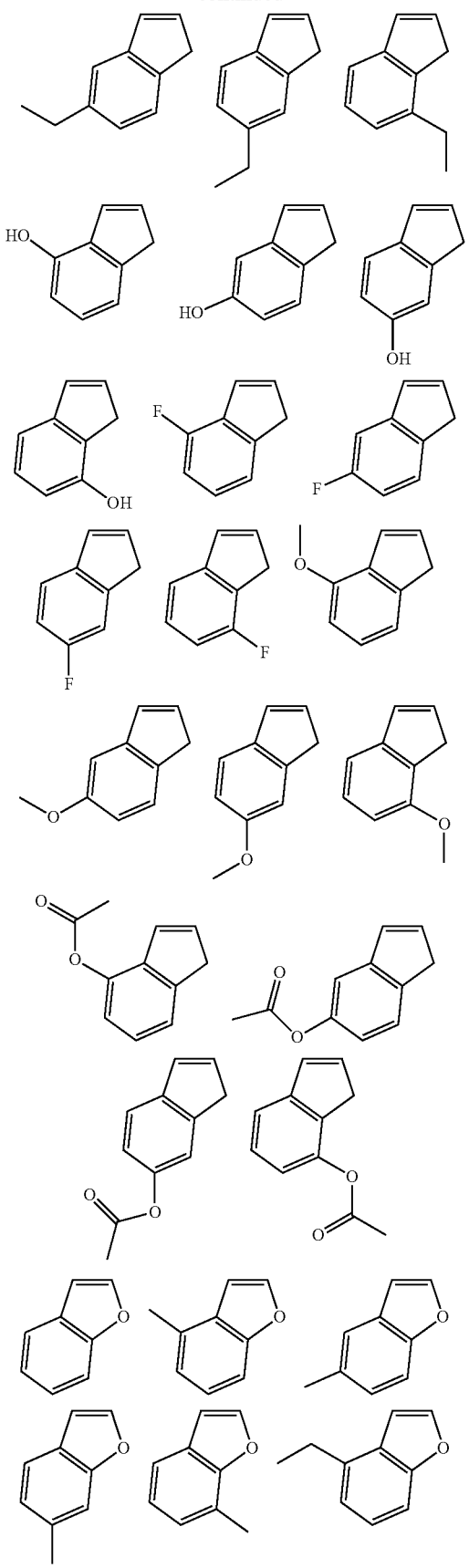
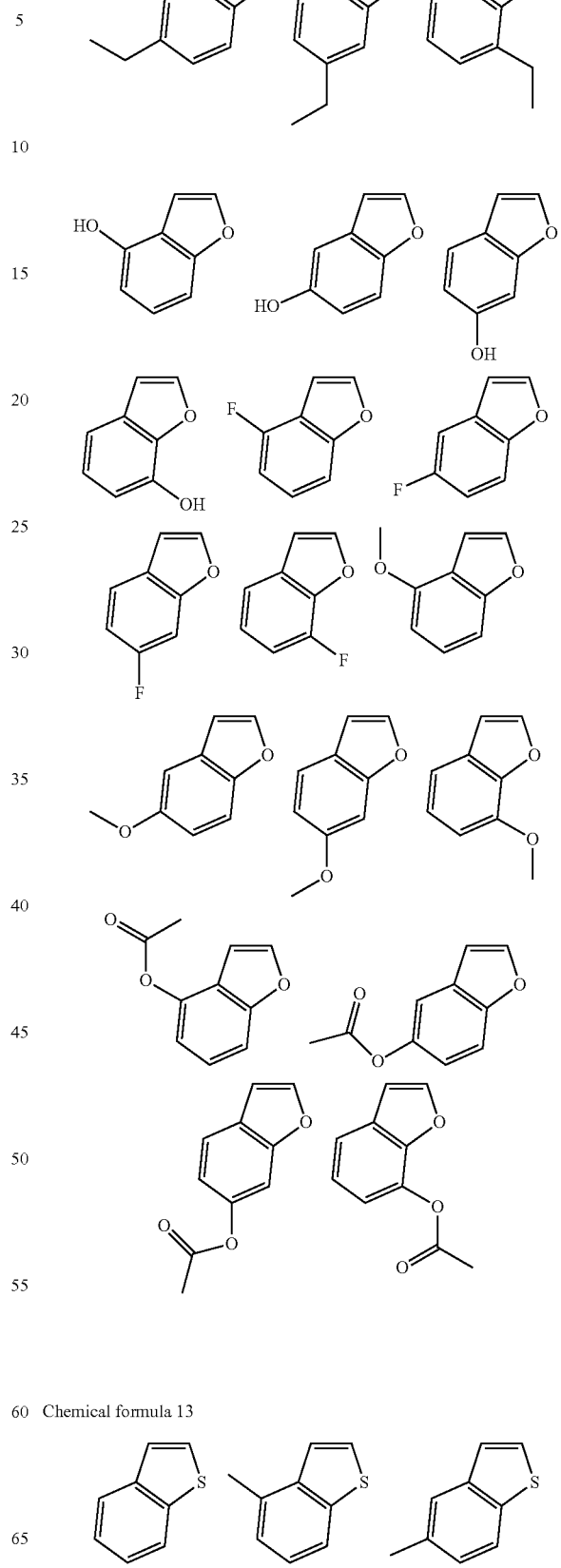
Chemical formula 13
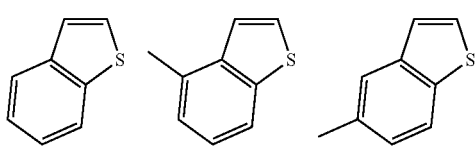

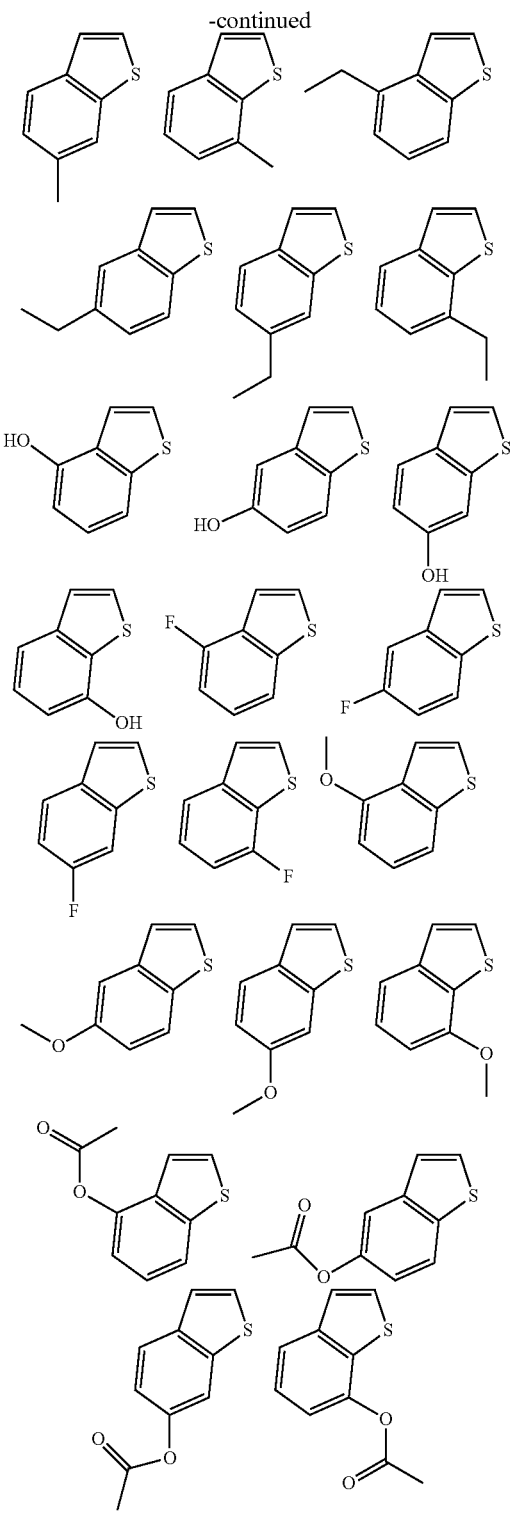

The composition of the present invention contains, as an essential component, a polymer containing a segment of a repeating unit p of a styrene having a 1,1,1,3,3,3-hexafluoro-2-propanol group, which is alkaline soluble. In order to suppress an outgas that is generated from the resist film during the exposure to an EUV light, the polymer of this invention has a segment of a repeating unit p and at least one segment selected from a repeating unit q1, q2, q3, and q4 copolymerized. Examples of the repeating unit q1 are a styrene, a vinyl-naphthalene, a vinyl-carbazole, a methacrylate with an aromatic group, and vinyl ether; examples of the repeating unit q2 are stilbenes, styryl-naphthalenes, dinaphthyl-ethylenes; examples of the repeating unit q3 are acenaphthylenes, indenes, benzofurans; and examples of the repeating unit q4 are benzothiophenes. Among the repeating units of q1, q2, q3, and q4, acenaphthylene, which is most effective in suppressing the generation of an outgas and in suppressing OOB light, is preferably used as a component of the polymer.

The repeating unit p of styrene having a 1,1,1,3,3,3-hexafluoro-2-propanol group and the repeating units of q1-q4 are in the range of $0.1 \leq p < 1.0$, $0 \leq q1 < 1.0$, $0 \leq q2 < 1.0$, $0 \leq q3 < 1.0$, $0 \leq q4 < 1.0$; preferably $0.2 \leq p \leq 1.0$, $0 \leq q1 \leq 0.7$, $0 \leq q2 \leq 0.7$, $0 \leq q3 \leq 0.7$, $0 \leq q4 \leq 0.7$. Regarding the molecular weight of the polymer containing the repeating unit of styrene having a 1,1,1,3,3,3-hexafluoro-2-propanol group, the weight-average molecular weight (Mw) is preferably in the range of $1,000 < Mw < 50,000$. If the molecular weight exceeds 50,000, the solubility of the polymer in the solvent and the alkaline developer might decrease. If Mw does not exceed 10,000, film loss of the resist pattern after developing might increase due to a part of the resist film being solubilized into the polymer.

Techniques generally used for polymerization of the polymer for the resist top coat of the present invention include radical polymerization using a radical polymerization initiator such as AIBN (azobisisobutyronitrile) and ion polymerization (anion polymerization) using an ionic initiator such as alkyllithium. The polymerization can be carried out in accordance with processes known in the art. Examples of the radical polymerization initiator include the following, although not limited thereto: azo-compounds, including 2,2'-Azobis(4-methoxy-2,4-dimethylvaleronitrile), 2,2'-Azobis(2,4-dimethylvaleronitrile), and 2,2'-azobisisobutyronitrile, 2,2'-Azobis(2,4,4-trimethylpentane); peroxide compounds, including tert-butyl peroxypivalate, lauroyl peroxide, Benzoyl peroxide, and tert-butyl peroxy laurate; water-soluble persulfates, including potassium persulfate; and redox initiators, such as a combination of peroxides and reducing agents, including a combination of hydrogen peroxide and sodium sulfite. Although the amount of the polymerization initiator used is appropriately changeable according to the type of initiator, polymerization reaction condition, and the like, the usual percent of an initiator to the whole monomer used is 0.001% to 5% by mass, and preferably 0.01% to 2.00% by mass.

Also, the polymerization reaction may be carried out in the presence of a polymerization solvent. The polymerization solvent should be selected from those that do not inhibit the polymerization reaction. Typical examples of polymerization solvents are: esters, including ethyl acetate, and n-butyl acetate; ketones, including acetone, methyl ethyl ketone, and methyl isobutyl ketone; aliphatic or aromatic hydrocarbons, including toluene, xylene, and cyclohexane; alcohols, including isopropyl alcohol and ethylene glycol monomethyl ether; ether-type solvents, including diethyl ether, dioxan, tetrahydrofuran, di-n-butyl ether, di-n-amyl ether, and diisoamyl ether. These solvents may be used singly or by mixing two or more of them. Also, a known molecular-weight modifier such as dodexyl mercaptan can be simultaneously used. However, the temperature of the polymerization reaction depends on the type of the polymerization initiator and on the boiling point of the solvent, which usually is in the range of 20° C. to 200° C., preferably in the range of 50° C. to 140° C. The reactor vessel used for such polymerization reactions is not especially limited. The removal of the organic solvent or water from the polymer solution or from the polymer dispersion thus obtained is usually carried out by any method known in the art. Examples of such methods are filtering after reprecipitation, and distillation under reduced pressure.

A solvent that dissolves the alkali-soluble polymer with a repeating unit of styrene having a 1,1,1,3,3,3-hexafluoro-2-propanol group is typically a C6-C10 ether solvent, and is preferably selected from the group of diisopropyl-ether, diisobutyl-ether, diisopentyl-ether, di-n-pentyl-ether, methylcyclopentyl-ether, methylcyclohexyl-ether, di-n-butyl-ether, di-sec-butyl-ether, diisopentyl-ether, di-sec-pentyl-ether, di-tert-amyl-ether, di-n-hexyl-ether, and mixtures thereof.

A solvent that does not dissolve the photoresist film is typically a C7-C12 hydrocarbon-based solvent having a boiling point of 85° C.-250° C. under 1 atm (1013 hPa), and preferably is selected from the group of n-heptane, isoheptane, 3-methyl hexane, 2,3-dimethyl pentane, 3-ethyl-pentane, 1,6-heptadiene, 5-methyl-1-hexyne, norbornane, norbornene, dicyclopentadiene, 1-methyl-1,4-cyclohexadiene, 1-heptyne, 2-heptyne, cycloheptane, cycloheptene, 1,3-dimethy-cyclopentane, ethylcyclopentane, methylcyclohexane, 1-methyl-1-cyclohexene, 3-methyl-1-cyclohexene, methylenecyclohexane, 4-methyl-1-cyclohexene, 2-methyl-1-hexene, 2-methyl-2-hexene, 1-heptene, 2-heptene, 3-heptene, n-octane, 2,2-dimethyl hexane, 2,3-dimethyl-hexane, 2,4-dimethyl-hexane, 2,5-dimethyl-hexane, 3,3-dimethyl-hexane, 3,4-dimethyl-hexane, 3-ethyl-2-methylpentane, 3-ethyl-3-methyl pentane, 2-methyl-heptane, 3-methyl-heptane, 4-methyl-heptane, 2,2,3-trimethyl-pentane, 2,2,4-trimethyl-pentane, cyclooctane, cyclooctene, 1,2-dimethyl-cyclohexane, 1,3-dimethyl-cyclohexane, 1,4-dimethyl-cyclohexane, ethyl-cyclohexane, vinyl-cyclohexane, isopropylcyclopentane, 2,2-dimethyl-3-hexene, 2,4-dimethyl-1-hexene, 2,5-dimethyl-1-hexene, 2,5-dimethyl-2-hexene, 3,3-dimethyl-1-hexene, 3,4-dimethyl-1-hexene, 4,4-dimethyl-1-hexene, 2-ethyl-1-hexene, 2-methyl-1-heptene, 1-octene, 2-octene, 3-octene, 4-octene, 1,7-octadiene, 1-octyne, 2-octyne, 3-octyne, 4-octyne, n-nonane, 2,3-dimethyl-heptane, 2,4-dimethyl-heptane, 2,5-dimethyl-heptane, 3,3-dimethyl-heptane, 3,4-dimethyl-heptane, 3,5-dimethyl-heptane, 4-ethyl-heptane, 2-methyl-octane, 3-methyl-octane, 4-methyl-octane, 2,2,4,4-tetramethyl-pentane, 2,2,4-trimethyl-hexane, 2,2,5-trimethyl-hexane, 2,2-dimethyl-3-heptane, 2,3-dimethyl-3-heptene, 2,4-dimethyl-1-heptene, 2,6-dimethyl-1-heptene, 2,6-dimethyl-3-heptene, 3,5-dimethyl-3-heptene, 2,4,4-trimethyl-1-hexene, 3,5,5-trimethyl-1-hexene, 1-ethyl-2-methyl-cyclohexane, 1-ethyl-3-methyl-cyclohexane, 1-ethyl-4-methyl-cyclohexane, propyl-cyclohexane, isopropyl-cyclohexane, 1,1,3-trimethyl-cyclohexane, 1,1,4-trimethyl-cyclohexane, 1,2,3-trimethyl-cyclohexane, 1,2,4-trimethyl-cyclohexane, 1,3,5-trimethyl-cyclohexane, allyl-cyclohexane, hydrindane, 1,8-nonadiene, 1-nonyne, 2-nonyne, 3-nonyne, 4-nonyne, 1-nonene, 2-nonene, 3-nonene, 4-nonene, n-decane, 3,3-dimethyl-octane, 3,5-dimethyl-octane, 4,4-dimethyl-octane, 3-ethyl-3-methyl-heptane, 2-methylnonane, 3-methylnonane, 4-methylnonane, tert-butyl-cyclohexane, butyl cyclohexane, isobutyl-cyclohexane, 4-isopropyl-1-methyl-cyclohexane, pentyl-cyclopentane, 1,1,3,5-tetramethyl-cyclohexane, cyclododecane, 1-decene, 2-decene, 3-decene, 4-decene, 5-decene, 1,9-decadiene, decahydronaphthalene, 1-decyne, 2-decyne, 3-decyne, 4-decyne, 5-decyne, 1,5,9-decatriene, 2,6-dimethyl-2,4,6-octatriene, limonene, myrcene, 1,2,3,4,5-pentamethyl-cyclopentadiene, α-Phellandrene, pinene, Terpinene, tetrahydrodicyclopentadiene, 5,6-dihydro-cyclopentadiene, dicyclopentadiene, 1,4-decadiyne, 1,5-decadiyne, 1,9-decadiyne, 2,8-decadiyne, 4,6-decadiyne, n-undecane, amyl cyclohexane, 1-undecene, 1,10-undecadien, 1-undecyne, 3-undecyne, 5-undecyne, tricyclo[6.2.1.0$^{2,7}$] undec-4-ene, n-dodecane, 2-methyl-undecane, 3-methyl-undecane, 4-methyl-undecane, 5-methyl-undecane, 2,2,4,6,6-penta-methyl-heptane, 1,3-dimethyl-adamantane, 1-ethyl-adamantane, 1,5,9-cyclododecatriene, toluene, xylene, cumene, mesitylene, styrene, α-methyl-styrene, butyl-benzene, sec-butyl-benzene, isobutyl benzene, cymene, diethylbenzene, 2-ethyl-p-xylene, 2-propyl toluene, 3-propyl toluene, 4-propyl toluene, 1,2,3,5-tetramethyl-toluene, 1,2,4,5-tetramethyl-toluene, tetrahydronaphthalene, 4-phenyl-1-butene, tert-amyl-benzene, amyl-benzene, 2-tert-butyl-toluene, 3-tert-butyl-toluene, 4-tert-butyl-toluene, 5-isopropyl-m-xylene, neopentyl benzene, 3-methyl-ethyl-benzene, tert-butyl-3-ethyl-benzene, 4-tert-butyl-o-xylene, 5-tert-butyl-m-xylene, tert-butyl-p-xylene, 1,2-diisopropyl-benzene, 1,3-diisopropyl-benzene, 1,4-diisopropyl-benzene, di-propyl-benzene, 3,9-dodecadiyne, pentamethyl-benzene, hexamethyl-benzene, hexyl-benzene, 1,3,5-triethyl-benzene, 1,2,4-trivinyl-cyclohexane, and mixtures thereof. The hydrocarbon-based solvent is preferably 30% or more by mass, more preferably 40% or more by mass, or even more preferably, 50% or more by mass, relative to the total mass of the C6-C10 ether solvent and the C7-C12 hydrocarbon-based solvent.

The top coat composition used in the patterning process of the present invention may contain an acid generator that can generate an acid by an active beam or by a radiation beam (photo acid generator). Any compound that can generate an acid by exposure to a high-energy beam as described above can be used as the acid generator. Examples of the preferable acid generator are sulfonium salts, iodonium salts, N-sulfonyl oxyimides, and oxime-O-sulfonates. These may be used singly or as a mixture of two or more of them, as will be explained later. Specific examples of acid generators are described in Paragraphs [0122] to [0142] of Patent Document 5. Adding an acid generator to the top coat composition reduces the degree of bridging defects between the resist patterns after developing.

The top coat composition used in the patterning process of the present invention may further contain an amine quencher. Typical examples of amine quenchers are described in Paragraphs of [0146] to [0164] of Patent Document 5. Adding an amine quencher improves the rectangularity of the resist pattern after developing. Adding both an acid generator and an amine quencher reduces the LWR of the resist pattern.

Surfactants may be added to the top coat composition of the present invention. Applicable surfactants are described in Paragraphs [0165] to [0166] of Patent Document 5.

The amount of a surfactant added to the top coat composition is preferably 0.0001 part to 10 parts by mass, preferably 0.001 part to 5 parts by mass, relative to 100 parts by mass of the top coat composition.

The photoresist composition used in the patterning of the present invention is a chemically amplified positive resist or negative resist, and it is preferable, for example, that the positive resist has a repeating unit e in which an acid labile group is bonded to the carboxyl group, and/or has a repeating unit f in which an acid labile group is bonded to the hydroxyl group, which is/are represented by formula (7) described in Paragraph 0041 of Patent Document 6. The composition further has a repeating unit in which an acidgenerating group is bonded to the main chain as described in Paragraph 0038 of that publication, so that edge (LWR) roughness can be reduced.

The weight-average molecular weight of the polymer in the resist composition is in the range of 1,000 to 500,000, preferably in the range of 2,000 to 30,000. By using a polymer whose molecular weight is 1,000 or more, the resist composition that is obtained has good heat resistance, and by using a polymer whose molecular weight is 500,000 or less, the resist composition that is obtained can have good alkaline solubility and will not cause any footing profile phenomenon after patterning.

In the multicomponent copolymer used in the resist composition, a too-wide molecular weight distribution (Mw/Mn) sometimes precipitates foreign matter on a pattern after exposure, or damages the pattern profile after exposure, due to the existence of both a low-molecular-weight component and a high-molecular-weight component in the copolymer. Therefore, in accordance with the progress of miniaturization in the pattern rule, the effects of the molecular weight and the molecular-weight distribution as mentioned above tend to be larger, and thus the molecular-weight distribution of a multicomponent copolymer to be used is preferably in the range of 1.0<(Mw/Mn)<2.0, or especially in the narrow-dispersion range of 1.0<(Mw/Mn)<1.5, so as to obtain a resist composition that can be suitably used in a fine-size pattern.

The patterning process using the resist top coat composition according to one embodiment of the present invention will now be explained. The patterning process of the embodiment includes at least the following steps: (1) forming a photoresist film on a substrate; (2) forming a resist top coat on the photoresist film by using the resist top coat composition of the present invention; (3) exposing the photoresist film; and (4) developing the photoresist film by use of a developer.

First, a photoresist film is formed on a substrate. This film may be formed, for example, by a spin-coating method. At this time, to reduce the amount of the photoresist film composition that is dispensed during spin coating, it is preferable that the photoresist film composition be dispensed by spin coating when the substrate is being wetted by a solvent for the photoresist or by a solution mixed with the solvent for the photoresist (see for example, Patent Document 7). This spin-coating method has an advantage that the photoresist film composition solution can be well spread on the substrate so as to reduce the amount of the photoresist film composition that is dispensed.

The film thickness of the resist film is preferably in the range of 5 nm to 500 nm, more preferably 10 nm to 300 nm. As the resist composition, a positive type or a negative type may be used. An example of a positive-type resist composition is one in which a part of the hydroxyl group of a polyhydroxy-styrene is substituted for by an acid labile group, which is described in Patent Document 8. An example of a polymethacrylate-based resist composition is one in which a methacrylate ester having a cyclic-acid labile group is copolymerized, which is described in Patent Document 9. Another example is a composition in which a polymerizable acid generator is polymerized, which is described in Patent Document 10.

Then the resist top coat is formed on the photoresist film using the resist top coat composition of the present invention. This top coat may be formed, for example, by a spin-coating method. In spin coating of the resist top coat composition, the same process as for the photoresist film as mentioned above can be used, and thus the resist top coat composition may be applied after the surface of the photoresist film is wetted by a solvent but before the resist top coat composition is applied. The film thickness of the resist top coat thus formed is preferably in the range of 2 nm to 200 nm, more preferably 5 nm to 50 nm. To wet the surface of the photoresist film by a solvent, a rotation-coating method or a vapor-prime method may be used, though a rotation-coating method is preferable. As to the solvent used during this process, it is preferable that there is used the aforementioned mixed solvent, consisting of the hydrocarbon-based solvent and the ether solvent, in which the photoresist film does not dissolve.

The alkaline-dissolution rate of the resist top coat of the embodiment is preferably 3 nm/second or higher, more preferably 5 nm/second or higher.

The top coat is formed on the resist film, and then is exposed in a vacuum to a light in the range of 3 nm to 15 nm or to an electron beam. After the exposure, baking (PEB: post-exposure bake) is performed as necessary, followed by the developing process, which is performed, for example, in an alkaline developer for 3 seconds to 300 seconds. A typical alkaline developer widely used is an aqueous tetramethylammonium hydroxide solution, with the concentration thereof being 2.38% by mass. An aqueous tetrabutylammonium hydroxide solution may be used in place of the aqueous tetramethylammonium hydroxide solution. In this latter case, it is preferable that the developing be performed by the alkaline developer to form the resist pattern on the photoresist film, and that the resist top coat on the photoresist film be removed at the same time. In that way, removal of the resist top coat can be performed more conveniently without installing removal equipment in addition to the existing equipment.

In addition to the process steps mentioned above, various other process steps, such as etching, resist removal, cleaning, and so forth, can be performed.

EXAMPLES AND COMPARATIVE EXAMPLES

The present invention will be specifically explained hereinbelow by presenting examples and comparative examples, but the present invention is not limited to the examples that follow.

A resist is prepared by dissolving into a solvent a resist polymer (1, 2) shown in the following general formula, an acid generator (PAG), an amine quencher, and a surfactant, in the amounts shown in Table 1. Each resist solution is dispensed on an Si substrate, and after spin coating, baking is performed by a hot plate at 110° C. for 60 seconds to produce a resist film having a film thickness of 100 nm. The solvents shown in Table 2 are dispensed on the resist film; after being left still for 30 seconds, spinning dry processing is executed; and the solvents are dried by performing baking by a hot plate at 100° C. for 60 seconds. The film thickness before dispensing the solvents and after dispensing the solvents was measured so as to determine the amount of reduction of film thickness after dispensing the solvents. The results are shown in Table 2.

Chemical formula 14

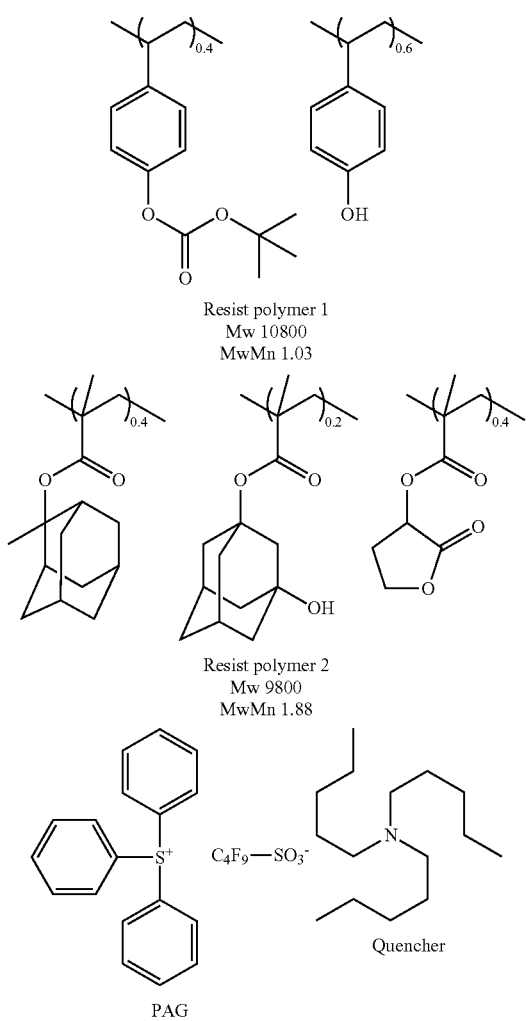

Resist polymer 1
Mw 10800
MwMn 1.03

Resist polymer 2
Mw 9800
MwMn 1.88

PAG

Quencher

TABLE 1

|  | Polymer (parts by mass) | Acid Generator: PAG (parts by mass) | Quencher (parts by mass) | Surfactant (parts by mass) | Solvent (parts by mass) |
|---|---|---|---|---|---|
| Resist Composition 1 | Resist polymer 1 (100) | PAG (5.0) | Quencher (1.0) | FC-4430 (0.001) | PGMEA (2,200) |
| Resist Composition 2 | Resist polymer 2 (100) | PAG (5.0) | Quencher (1.0) | FC-4430 (0.001) | PGMEA (2,200) |

PGMEA: propylene glycol monomethyl ether acetate polymerizable
FC-4430: fluorine-based surfactant manufactured by Sumitomo 3M

TABLE 2

| | Resist | Solvent (parts by mass) | Amount of Film Loss (nm) |
|---|---|---|---|
| Example 1-1 | Resist composition 1 | Diisopentyl ether (150) Decane (550) | 3 |
| Example 1-2 | Resist composition 1 | Diisopentyl ether (150) Octane (100) Nonane (500) | 3 |

TABLE 2-continued

| | Resist | Solvent (parts by mass) | Amount of Film Loss (nm) |
|---|---|---|---|
| Example 1-3 | Resist composition 1 | Diisopentyl ether (150) n-Heptane (100) Decane (500) | 3 |
| Example 1-4 | Resist composition 1 | Dibutyl ether (200) Mesitylene (600) Methylcyclohexane (50) | 4 |
| Example 1-5 | Resist composition 1 | Dihexyl ether (200) t-butyl benzene (500) 3-methyl hexane (100) | 4 |
| Example 1-6 | Resist composition 1 | Diisopentyl ether (300) Dicyclopentadiene (300) | 3 |
| Example 1-7 | Resist composition 1 | Diisopentyl ether (300) Tetrahydrodicyclo-pentadiene (200) Octane (100) | 2 |
| Example 1-8 | Resist composition 1 | Diisopentyl ether (300) Tetrahydrodicyclo-pentadiene (200) Octane (100) | 3 |
| Example 1-9 | Resist composition 1 | Diisopentyl ether (300) 1,4-dimethyl cyclohexane (300) | 2 |
| Example 1-10 | Resist composition 1 | Diisopentyl ether (300) 3,4-Dimethyl-1-hexene (300) | 3 |
| Example 1-11 | Resist composition 1 | Diisopentyl ether (200) 2-Nonyne (400) | 3 |
| Example 1-12 | Resist composition 1 | Diisopentyl ether (200) Iso-butyl cyclohexane (400) | 2 |
| Example 1-13 | Resist composition 1 | Diisopentyl ether (300) Pinene (300) | 2 |
| Example 1-14 | Resist composition 1 | Diisopentyl ether (300) Terpinene (300) | 2 |
| Example 1-15 | Resist composition 2 | Diisopentyl ether (150) Decane (550) | 2 |
| Comparative Example 1-1 | Resist composition 1 | Diisopentyl ether (700) | 20 |
| Comparative Example 1-2 | Resist composition 1 | 4-Methyl-2-pentanol (700) | Completely dissolved |
| Comparative Example 1-3 | Resist composition 1 | Decane (700) | 3 |
| Comparative Example 1-4 | Resist composition 2 | Diisopentyl ether (700) | 6 |
| Comparative Example 1-5 | Resist composition 2 | 4-Methyl-2-pentanol (700) | 15 |
| Comparative Example 1-6 | Resist composition 2 | Decane (700) | 3 |

The solubility of the resist composition 1 in the solvents is high. The resist film of the composition 1 was completely dissolved when a 4-Methyl-2-pentanol solvent was dispensed, and substantial film loss in the resist film of the composition 1 also occurred when a diisopentyl ether solvent, which has low solubility, was dispensed. It was confirmed in the examples that dispensing a mixed solution of a diisopentyl-ether solvent and a hydrocarbon-based solvent of the present invention prevents film loss.

Listed below are the polymers used for a top coat; each of the polymers has a repeating unit of styrene having a 1,1,1,3,3,3-hexafluoro-2-propanol group and of acenaphthylene.

The resist top coat solutions of TC-1-TC-24 and Comparatives TC-1-TC-4 were prepared with the compositions as shown in Tables 3 and 4, which contain top coat polymers, additives, and solvents. In comparative TC-4, the comparative resist top coat polymer-1 was not fully dissolved into decane.

Chemical formula 15
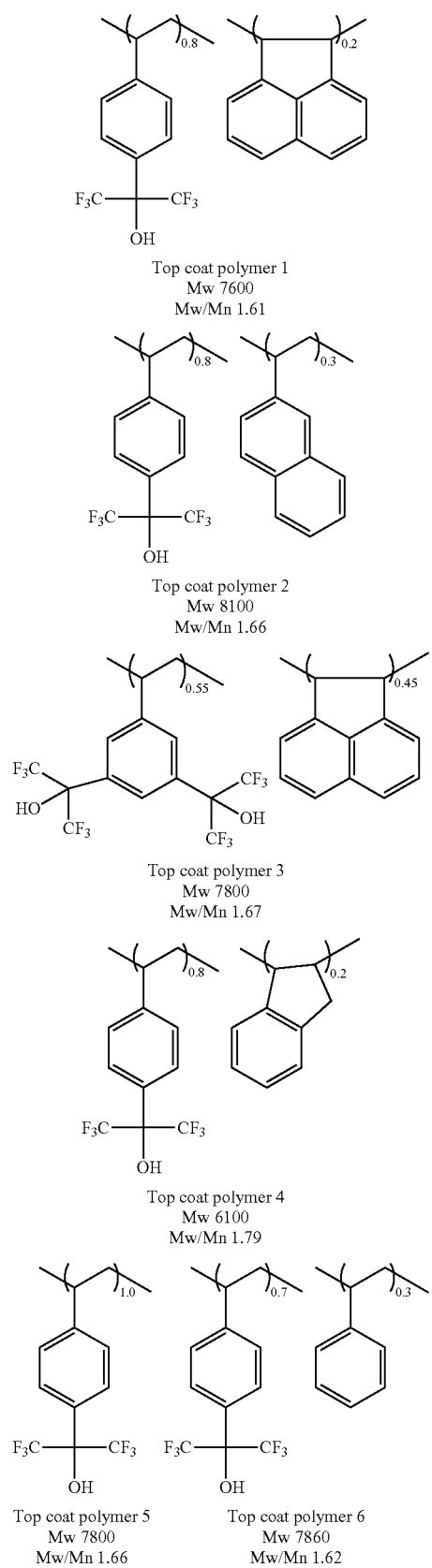
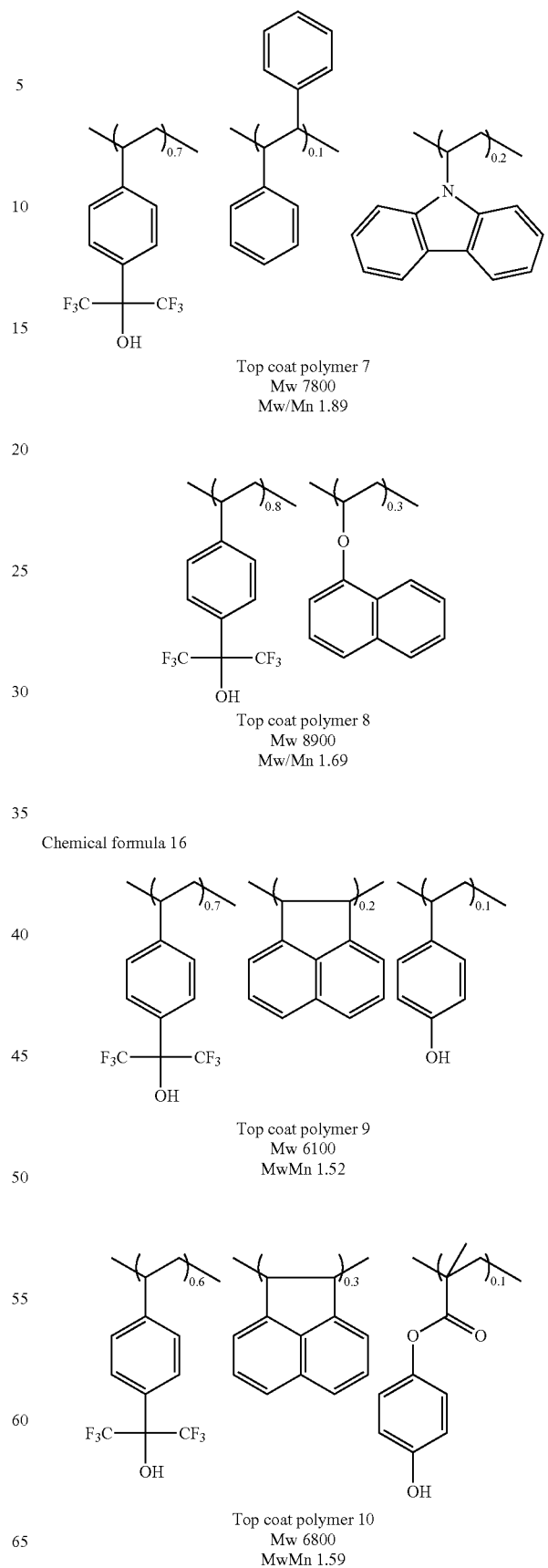

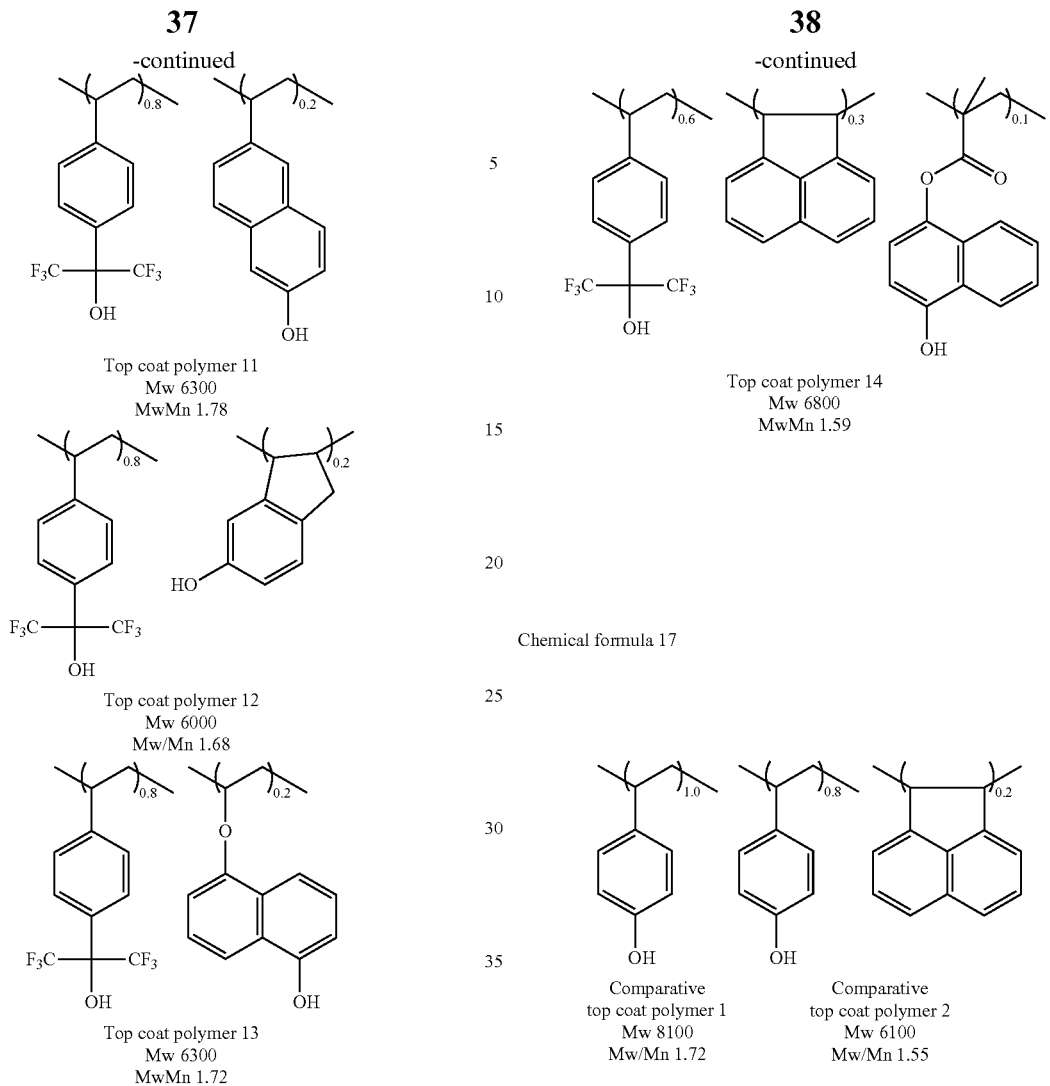

Chemical formula 17

TABLE 3

| | Base Material (parts by mass) | Additives (parts by weight) | Solvent (parts by mass) |
|---|---|---|---|
| TC-1 | Top coat polymer 1 (10) | | Diisopentyl ether (150) Decane (550) |
| TC-2 | Top coat polymer 2 (10) | | Diisopentyl ether (150) Octane (100) Nonane (500) |
| TC-3 | Top coat polymer 3 (10) | | Diisopentyl ether (150) n-Heptane (100) Decane (500) |
| TC-4 | Top coat polymer 4 (10) | | Dibutyl ether (200) Mesitylene (600) Methylcyclohexane (50) |
| TC-5 | Top coat polymer 5 (10) | | Dihexyl ether (200) t-butyl benzene (500) 3-methyl hexane (100) |
| TC-6 | Top coat polymer 6 (10) | | Diisopentyl ether (300) Dicyclopentadiene (300) |
| TC-7 | Top coat polymer 7 (10) | | Diisopentyl ether (300) Tetrahydrodicyclopentadiene (200) Octane (100) |
| TC-8 | Top coat polymer 8 (10) | | Diisopentyl ether (300) Tetrahydrodicyclopentadiene (200) Octane (100) |
| TC-9 | Top coat polymer 9 (10) | | Diisopentyl ether (150) Decane (550) |

TABLE 3-continued

| | Base Material (parts by mass) | Additives (parts by weight) | Solvent (parts by mass) |
|---|---|---|---|
| TC-10 | Top coat polymer 10 (10) | | Diisopentyl ether (150) Decane (550) |
| TC-11 | Top coat polymer 11 (10) | | Diisopentyl ether (150) Decane (550) |
| TC-12 | Top coat polymer 12 (10) | | Diisopentyl ether (150) Decane (550) |
| TC-13 | Top coat polymer 13 (10) | | Diisopentyl ether (150) Decane (550) |
| TC-14 | Top coat polymer 14 (10) | | Diisopentyl ether (150) Decane (550) |
| TC-15 | Top coat polymer 1 (10) | | Diisopentyl ether (300) 1,4-dimethyl cyclohexane (300) |
| TC-16 | Top coat polymer 1 (10) | | Diisopentyl ether (300) 3,4-Dimethyl-1-hexene (300) |
| TC-17 | Top coat polymer 1 (10) | | Diisopentyl ether (200) 2-Nonyne (400) |
| TC-18 | Top coat polymer 1 (10) | tri-n-octylamine (0.01) | Diisopentyl ether (200) Iso-butyl cyclohexane (400) |
| TC-19 | Top coat polymer 1 (10) | 1-aminopyrene (0.01) | Diisopentyl ether (300) Pinene (300) |
| TC-20 | Top coat polymer 1 (10) | | Diisopentyl ether (300) Terpinene (300) |
| TC-21 | Top coat polymer 1 (10) | | Diisopentyl ether (300) 2,2,4-trimethyl pentane (100) Cyclo dodecane (200) |
| TC-22 | Top coat polymer 1 (10) | | Diisopentyl ether (300) Butylcyclohexane (300) |
| TC-23 | Top coat polymer 1 (10) | | Diisopentyl ether (300) Cyclo dodecane (300) |

TABLE 4

| | Base Material (parts by mass) | Additives (parts by weight) | Solvent (parts by mass) |
|---|---|---|---|
| TC-24 | Top coat polymer 1 (10) | | Diisopentyl ether (300) 2-Decene (300) |
| TC-25 | Top coat polymer 1 (10) | | Dibutyl ether (300) 2,2,4,6,6-penta-Methyl-heptane |
| TC-26 | Top coat polymer 1 (10) | | Diisopentyl ether (300) α-methyl styrene (200) |
| TC-27 | Top coat polymer 1 (10) | | Diisopentyl ether (300) 1-Decene (300) |
| TC-28 | Top coat polymer 1 (10) | | Diisopentyl ether (400) 4-Decyne (200) |
| TC-29 | Top coat polymer 1 (10) | | Diisopentyl ether (400) Limonene (200) |
| TC-30 | Top coat polymer 1 (10) | | Diisopentyl ether (400) n-Undecane (200) |
| TC-31 | Top coat polymer 1 (10) | | Diisopentyl ether (400) Cumene (200) |
| Comparative TC-1 | Comparative top coat polymer 1 (10) | | 4-Methyl-2-pentanol (700) |
| Comparative TC-2 | Comparative top coat polymer 2 (10) | | 4-Methyl-2-pentanol (300) Diisopentyl ether (400) |
| Comparative TC-3 | Top coat polymer 1 (10) | | Diisopentyl ether (550) |
| Comparative TC-4 | Top coat polymer 1 (10) | | Decane (600) |

Each of the resist top coat solutions TC-1 to TC-31 and Comparatives TC-1 to TC-3 was applied on a silicon substrate by spin coating, and then baked at 100° C. for 60 seconds so as to obtain each of the resist top coats having a film thickness of 20 nm (TC-1 to TC-31, and Comparatives TC-1 to TC-3). Then, developing the silicon substrate having the resist top coat formed thereon by the foregoing method was performed in an aqueous tetramethylammonium hydroxide solution (TMAH) having a concentration of 2.38% by mass for 30 seconds, and then the film thickness of the resist top coat after developing was measured. The results thereof are shown in the following Table 5. It was confirmed that the entirety of the resist top coat was dissolved after being developed.

TABLE 5

| Resist Top Coat | Film Thickness After Development (nm) |
|---|---|
| TC-1 | 0 |
| TC-2 | 0 |
| TC-3 | 0 |

TABLE 5-continued

| Resist Top Coat | Film Thickness After Development (nm) |
|---|---|
| TC-4 | 0 |
| TC-5 | 0 |
| TC-6 | 0 |
| TC-7 | 0 |
| TC-8 | 0 |
| TC-9 | 0 |
| TC-10 | 0 |
| TC-11 | 0 |
| TC-12 | 0 |
| TC-13 | 0 |
| TC-14 | 0 |
| TC-15 | 0 |
| TC-16 | 0 |
| TC-17 | 0 |
| TC-18 | 0 |
| TC-19 | 0 |
| TC-20 | 0 |
| TC-21 | 0 |
| TC-22 | 0 |
| TC-23 | 0 |
| TC-24 | 0 |
| TC-25 | 0 |
| TC-26 | 0 |
| TC-27 | 0 |
| TC-28 | 0 |
| TC-29 | 0 |
| TC-30 | 0 |
| TC-31 | 0 |
| Comparative TC-1 | 0 |
| Comparative TC-2 | 0 |
| Comparative TC-4 | 0 |

Evaluation of EUV-Exposure

The photoresist composition used for evaluating the exposure was the EUV resist composition SEVR-140, manufactured by Shin-Etsu Chemical Co., Ltd. The resist composition was applied on an Si wafer that had a diameter of 300 mm and that was pretreated by baking at a temperature of 200° C., then vapor primed with hexamethyldisilazane (HDMS), and then baked at a temperature of 105° C. for 60 seconds so as to form a resist film having a film thickness of 50 nm. Then a top coat solution was applied on the resist film, which was baked at a temperature of 100° C. for 60 seconds so as to form a resist top coat having a film thickness of 20 nm. The obtained resist top coat was exposed to a light by using an EUV scanner NXE 3100 (NA of 0.25 and 8 of 0.8 with normal illumination) manufactured by ASML, then baked (PEB: post exposure bake) at a temperature of 95° C. for 60 seconds, and then developed in an aqueous tetramethylammonium hydroxide solution (TMAH) having a concentration of 2.38% by mass for 30 seconds. The amount of exposure to achieve the predetermined dimensions for the 34-nm line-and-space pattern was obtained so as to measure the edge roughness (LWR). The results of the measurements above are shown in Table 6.

TABLE 6

| | Resist Name | Resist Top Coat | Sensitivity (mJ/cm$^2$) | LWR (nm) |
|---|---|---|---|---|
| Example 2-1 | SEVR-140 | TC-1 | 15.20 | 5.21 |
| Example 2-2 | SEVR-140 | TC-2 | 15.21 | 5.10 |
| Example 2-3 | SEVR-140 | TC-3 | 15.55 | 5.11 |
| Example 2-4 | SEVR-140 | TC-4 | 15.20 | 5.16 |
| Example 2-5 | SEVR-140 | TC-5 | 15.80 | 5.08 |
| Example 2-6 | SEVR-140 | TC-6 | 15.11 | 5.09 |
| Example 2-7 | SEVR-140 | TC-7 | 15.03 | 5.11 |
| Example 2-8 | SEVR-140 | TC-8 | 15.18 | 5.15 |
| Example 2-9 | SEVR-140 | TC-9 | 14.98 | 5.08 |
| Example 2-10 | SEVR-140 | TC-10 | 14.91 | 5.18 |
| Example 2-11 | SEVR-140 | TC-11 | 14.82 | 5.10 |
| Example 2-12 | SEVR-140 | TC-12 | 15.02 | 5.10 |
| Example 2-13 | SEVR-140 | TC-12 | 15.01 | 5.02 |
| Example 2-14 | SEVR-140 | TC-12 | 15.00 | 5.06 |
| Example 2-15 | SEVR-140 | TC-12 | 15.20 | 5.07 |
| Example 2-16 | SEVR-140 | TC-12 | 15.21 | 5.03 |
| Example 2-17 | SEVR-140 | TC-12 | 15.22 | 5.04 |
| Example 2-18 | SEVR-140 | TC-12 | 15.20 | 5.05 |
| Example 2-19 | SEVR-140 | TC-12 | 15.19 | 5.06 |
| Example 2-20 | SEVR-140 | TC-12 | 15.20 | 5.09 |
| Example 2-21 | SEVR-140 | TC-12 | 15.20 | 5.12 |
| Example 2-22 | SEVR-140 | TC-12 | 15.20 | 5.15 |
| Example 2-23 | SEVR-140 | TC-12 | 15.22 | 5.13 |
| Example 2-24 | SEVR-140 | TC-12 | 15.23 | 5.09 |
| Example 2-25 | SEVR-140 | TC-12 | 15.31 | 5.05 |
| Example 2-26 | SEVR-140 | TC-12 | 15.33 | 5.19 |
| Example 2-27 | SEVR-140 | TC-12 | 15.29 | 5.11 |
| Example 2-28 | SEVR-140 | TC-12 | 15.22 | 5.12 |
| Example 2-29 | SEVR-140 | TC-12 | 15.26 | 5.13 |
| Example 2-30 | SEVR-140 | TC-12 | 15.21 | 5.14 |
| Example 2-31 | SEVR-140 | TC-12 | 15.18 | 5.12 |
| Comparative Example 2-1 | SEVR-140 | Comparative TC-1 | 14.33 | 6.43 |
| Comparative Example 2-2 | SEVR-140 | Comparative TC-2 | 14.21 | 6.10 |
| Comparative Example 2-3 | SEVR-140 | Comparative TC-3 | 15.30 | 5.35 |
| Comparative Example 2-4 | SEVR-140 | | 14.20 | 5.30 |

As described above, applying the top coat of the present invention to a resist reduces the film loss of the resist film, thereby reducing edge roughness (LWR).

Although the invention has been described in connection with the preferred embodiments, it should be understood that the invention is not limited to the disclosed embodiments, but, on the contrary, the invention is intended to cover various modifications without departing from the technical scope of the invention.

The invention claimed is:

1. A resist top coat composition, used in a patterning process by lithography in which a photoresist film on a wafer is top coated with the top coat composition, and then exposed and developed, wherein the resist top coat composition contains:

a polymer as a base resin having a repeating unit p of styrene having a 1,1,1,3,3,3-hexafluoro-2-propanol group shown by the following general formula (1), wherein m is 1 or 2, and p is in the range of 0<p≤1.0, a C6-C10 ether solvent; and a C7-C12 hydrocarbon-based solvent;

wherein the C6-C10 ether solvent is selected from the group of diisopropyl ether, diisobutyl ether, diisopentyl ether, di-n-pentyl ether, methylcyclopentyl ether, methyl cyclohexyl ether, di-n-butyl ether, di-sec-butyl ether diisopentyl-ether, di-sec-pentyl ether, di-tert-amyl ether, di-n-hexyl ether, and mixtures thereof; and wherein the C7-C12 hydrocarbon-based solvent is more than 30% by mass relative to the total of the C6-C10 ether solvent and the C7-C12 hydrocarbon-based solvent;

Chemical formula 1

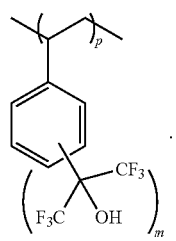

(1)

2. The resist top coat composition according to claim 1, wherein the polymer as a base resin is a copolymer of a repeating unit p of a styrene having a 1,1,1,3,3,3-hexafluoro-2-propanol group and one or more repeating units selected from the repeating units q1-q4 shown by the following general formula (2), wherein $R^1$ is hydrogen, methyl; $X_1$, is a single bond, —C(=O)—O—, —O—, —N=; $X_2$ and $X_3$ are independently phenylene, naphthylene; $X_4$ is methylene, oxygen, sulfur; $R^2$ is C6-C20-allyl, C2-C6-alkenyl; $R^3$, $R^4$, $R^5$, and $R^6$ are independently hydrogen, hydroxyl, linear, branched or cyclic C1-C10-alkyl, C2-C6-alkenyl, C6-C10-allyl, alkoxy, acyloxy, cyano, nitro, amino, halogen; the alkyl, the alkenyl and the allyl may have hydroxyl, linear branched or cyclic C1-C10-alkyl, alkoxy, acyloxy, cyano, nitro, amino, halogen; v is 1 or 2; and $0<p<1.0$, $0 \leq q1<1.0$, $0 \leq q2<1.0$, $0 \leq q3<1.0$, $0 \leq q4<1.0$, and $0<q1+q2+q3+q4<1.0$;

Chemical formula 2

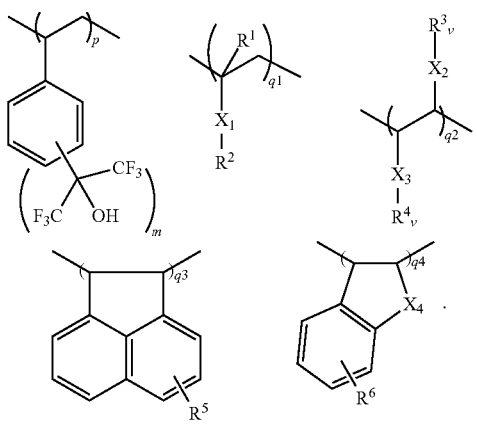

(2)

3. The resist top coat composition according to claim 1, wherein the resist top coat composition is soluble in an alkaline developer.

4. The resist top coat composition according to claim 1, wherein the C7-C12 hydrocarbon-based solvent has a boiling point in the range of 85° C.-250° C. under 1 atm (1013 hPa).

5. The resist top coat composition according to claim 4, wherein the C7-C12 hydrocarbon-based solvent is selected from the group of n-heptane, isoheptane, 3-methyl hexane, 2,3-dimethyl-pentane, 3-ethyl-pentane, 1,6-heptadiene, 5-methyl-1-hexyne, norbornane, norbornene, dicyclopentadiene, 1-methyl-1,4-cyclohexadiene, 1-heptyne, 2-heptyne, cycloheptane, cycloheptene, 1,3-dimethy-cyclopentane, ethyl-cyclopentane, methyl-cyclohexane, 1-methyl-1-cyclohexene, 3-methyl-1-cyclohexene, methylenecyclohexane, 4-methyl-1-cyclohexene, 2-methyl-1-hexene, 2-methyl-2-hexene, 1-heptene, 2-heptene, 3-heptene, n-octane, 2,2-dimethyl-hexane, 2,3-dimethyl-hexane, 2,4-dimethyl-hexane, 2,5-dimethyl-hexane, 3,3-dimethyl-hexane, 3,4-dimethyl-hexane, 3-ethyl-2-methyl-pentane, 3-ethyl-3-methyl-pentane, 2-methyl-heptane, 3-methyl-heptane, 4-methyl-heptane, 2,2,3-trimethyl-pentane, 2,2,4-trimethyl-pentane, cyclooctane, cyclooctene, 1,2-dimethyl-cyclohexane, 1,3-dimethyl-cyclohexane, 1,4-dimethyl-cyclohexane, ethyl-cyclohexane, vinyl-cyclohexane, isopropyl-cyclopentane, 2,2-dimethyl-3-hexene, 2,4-dimethyl-1-hexene, 2,5-dimethyl-1-hexene, 2,5-dimethyl-2-hexene, 3,3-dimethyl-1-hexene, 3,4-dimethyl-1-hexene, 4,4-dimethyl-1-hexene, 2-ethyl-1-hexene, 2-methyl-1-heptene, 1-octene, 2-octene, 3-octene, 4-octene, 1,7-octadiene, 1-octyne, 2-octyne, 3-octyne, 4-octyne, n-nonane, 2,3-dimethyl-heptane, 2,4-dimethyl-heptane, 2,5-dimethyl-heptane, 3,3-dimethyl-heptane, 3,4-dimethyl-heptane, 3,5-dimethyl-heptane, 4-ethyl-heptane, 2-methyl-octane, 3-methyl-octane, 4-methyl-octane, 2,2,4,4-tetramethylpentane, 2,2,4-trimethyl hexane, 2,2,5-trimethyl-hexane, 2,2-dimethyl-3-heptene, 2,3-dimethyl-3-heptene, 2,4-dimethyl-1-heptene, 2,6-dimethyl-1-heptene, 2,6-dimethyl-3-heptene, 3,5-dimethyl-3-heptene, 2,4,4-Trimethyl-1-hexene, 3,5,5-trimethyl-1-hexene, 1-ethyl-2-methyl-cyclohexane, 1-ethyl-3-methyl-cyclohexane, 1-ethyl-4-methyl-cyclohexane, propyl cyclohexane, isopropyl cyclohexane, 1,1,3-trimethyl-cyclohexane, 1,1,4-trimethyl-cyclohexane, 1,2,3-trimethyl-cyclohexane, 1,2,4-trimethyl-cyclohexane, 1,3,5-trimethyl-cyclohexane, allyl cyclohexane, hydrindane, 1,8-nonadiene, 1-nonyne, 2-nonyne, 3-nonyne, 4-nonyne, 1-nonene, 2-nonene, 3-nonene, 4-nonene, n-decane, 3,3-dimethyl-octane, 3,5-dimethyl-octane, 4,4-dimethyl-octane, 3-ethyl-3-methyl heptane, 2-methyl-nonane, 3-methyl-nonane, 4-methyl-nonane, tert-butyl-cyclohexane, butylcyclohexane, iso-butyl-cyclohexane, 4-isopropyl-1-methyl-cyclohexane, pentyl-cyclopentane, 1,1,3,5-tetramethyl-cyclohexane, cyclododecane, 1-decene, 2-decene, 3-decene, 4-decene, 5-decene, 1,9-decadiene, decahydronaphthalene, 1-decyne, 2-decyne, 3-decyne, 4-decyne, 5-decyne, 1,5,9-decatriene, 2,6-dimethyl-2,4,6-octatriene, limonene, myrcene, 1,2,3,4,5-pentamethyl-cyclopentadiene, α-phellandrene, pinene, terpinene, tetrahydrodicyclopentadiene, 5,6-dihydro-cyclopentadiene, dicyclopentadiene, 1,4-decadiyne, 1,5-decadiyne, 1,9-decadiyne, 2,8-decadiyne, 4,6-decadiyne, n-undecane, amyl-cyclohexane, 1-undecene, 1,10-undecadien, 1-undecyne, 3-undecyne, 5-undecyne, tricyclo[6.2.1.0$^{2,7}$]undec-4-ene, n-dodecane, 2-methyl-undecane, 3-methyl-undecane, 4-methyl-undecane, 5-methyl-undecane, 2,2,4,6,6-penta-methyl-heptane, 1,3-dimethyl-adamantane, 1-ethyl-adamantane, 1,5,9-cyclododecatriene, toluene, xylene, cumene, 1,2,3-trimethylbenzene, 1,2,4-trimethylbenzene, 1,3,5-trimethylbenzene, styrene, α-methyl-styrene, butyl-benzene, sec-butyl-benzene, isobutyl-benzene, cymene, diethyl-benzene, 2-ethyl-p-xylene, 2-propyl-toluene, 3-propyl-toluene, 4-propyl-toluene, 1,2,3,5-tetramethyl-toluene, 1,2,4,5-tetramethyl-toluene, tetrahydro-naphthalene, 4-phenyl-1-butene, tert-amyl-benzene, amyl-benzene, 2-tert-butyl-toluene, 3-tert-butyl-toluene, 4-tert-butyl-toluene, 5-isopropyl-m-xylene, 3-methyl-ethylbenzene, tert-butyl-3-ethylbenzene, 4-tert-butyl-o-xylene, 5-tert-butyl-m-xylene, tert-butyl-p-xylene, 1,2-diisopropyl-benzene, 1,3-diisopropyl-benzene, 1,4-diisopropyl-benzene, di-propyl benzene, 3,9-dodecadiyne, pentamethylbenzene, hexamethylbenzene, hexyl-benzene, 1,3,5-triethyl-benzene, 1,2,4-trivinyl-cyclohexane, and mixtures thereof.

6. A patterning process by lithography in which a photoresist film on a wafer is top coated with a resist top coat composition, and then exposed and developed, and wherein the resist top coat composition is one of claim 1.

7. The patterning process according to claim 6, wherein the development of the photoresist film by an alkaline developer and a removal of the resist top coat formed by using the resist top coat composition are simultaneously performed during the developing process after exposure.

8. A patterning process in which a resist top coat is formed on a photoresist film formed on a wafer, an exposure being performed in a vacuum, and wherein the resist top coat composition is one of claim 1.

9. The patterning process according to claim 8, wherein the exposure is carried out by a light in the range of 3 nm to 15 nm wavelength, or by an electron beam.

* * * * *